United States Patent
Jeong et al.

(10) Patent No.: US 8,190,981 B2
(45) Date of Patent: May 29, 2012

(54) APPARATUS AND METHOD FOR TRANSMITTING AND RECEIVING DATA IN A COMMUNICATION SYSTEM USING LOW DENSITY PARITY CHECK CODES

(75) Inventors: Hong-Sil Jeong, Seoul (KR); Se-Ho Myung, Suwon-si (KR); Jae-Yoel Kim, Suwon-si (KR); Sung-Ryul Yun, Suwon-si (KR); Hak-Ju Lee, Incheon (KR); Kyeongcheol Yang, Pohang-si (KR); Hyeon-Koo Yang, Pohang-si (KR); Dong-Min Shin, Seoul (KR); Kyung-Joong Kim, Pohang-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 944 days.

(21) Appl. No.: 12/229,917

(22) Filed: Aug. 28, 2008

(65) Prior Publication Data
US 2009/0063929 A1 Mar. 5, 2009

(30) Foreign Application Priority Data

Aug. 28, 2007 (KR) .................. 10-2007-0086786
Aug. 29, 2007 (KR) .................. 10-2007-0087076
Sep. 18, 2007 (KR) .................. 10-2007-0094464

(51) Int. Cl.
*H03M 13/00* (2006.01)
(52) U.S. Cl. ........ 714/801; 714/755; 714/752; 714/758; 714/746; 714/751; 714/804; 714/792

(58) Field of Classification Search .................... None
See application file for complete search history.

(56) References Cited

U.S. PATENT DOCUMENTS

| | | | | |
|---|---|---|---|---|
| 7,577,207 | B2 * | 8/2009 | Eroz et al. | 375/261 |
| 2005/0060635 | A1 * | 3/2005 | Eroz et al. | 714/801 |
| 2005/0216821 | A1 * | 9/2005 | Harada | 714/801 |
| 2008/0082894 | A1 * | 4/2008 | Eroz et al. | 714/758 |
| 2009/0187804 | A1 * | 7/2009 | Shen et al. | 714/752 |
| 2011/0047435 | A1 * | 2/2011 | Eroz et al. | 714/755 |

FOREIGN PATENT DOCUMENTS

| | | |
|---|---|---|
| EP | 1701450 | 9/2006 |
| KR | 2007-22569 | 2/2007 |

OTHER PUBLICATIONS

Li Yan, et al.; "Bit-Reliability Mapping in LDPC-Coded Modulation Systems;" IEEE Communication Letters; vol. 9, No. 1; Jan. 1, 2005; XP001211457.*

(Continued)

*Primary Examiner* — John Trimmings
(74) *Attorney, Agent, or Firm* — Cha & Reiter, LLC

(57) ABSTRACT

An apparatus for transmitting data in a communication system using a Low Density Parity Check (LDPC) matrix is provided. The apparatus includes an interleaver for interleaving a descending bit-ordered codeword having a predetermined size and in accordance with a predetermined modulation scheme; and a bit mapper for mapping codeword bits constituting the interleaved codeword in accordance with a predetermined mapping scheme that takes into account degrees of the codeword bits and reliability characteristics of modulation symbol-constituting bits based on the predetermined modulation scheme.

16 Claims, 11 Drawing Sheets

OTHER PUBLICATIONS

DVB; Samsung Electronics Co., Ltd. Proposal for DVB-T2; "Frame Structure, Channel Coding and Modulation for Entire DVB-T2 Baseline System Proposal;" Jun. 4, 2007; XP017817440.

DVB; "RAI Reply to TM-3719r3 DVB-TM-T2 Call for Technologies," Jun. 4, 2007; XP017817438.

Li, Yan, et al.; "Bit-Reliability Mapping in LDPC-Coded Modulation Systems;" IEEE Communication Letters; vol. 9, No. 1; Jan. 1, 2005; XP001211457.

Hong, Song-Nam, et al.; Patent Application Publication No. US 2007/0033486 A1; Publication Date: Feb. 8, 2007; Channel Interleaving/Deinterleaving Apparatus in a Communication . . . .

Harada, Kohsuke; Patent Application Publication No. US 2005/0216821 A1; Publication Date: Sep. 29, 2005; Mapping Method for Encoded Bits Using LDPC Code . . . .

Yang, Hyun-Koo, et al.; "Optimization of Degree-Profile Matching Interleavers for LDPC-Coded Modulation;" IEEE Communications Letters, vol. 10, No. 12; Dec. 2006.

$3^{rd}$ Generation Partnership Project; cdma2000 High Rate Packet Data Air Interface Specification; 3 GPP2 C.0024, Version 2.0, Oct. 27, 2000.

Moon, Todd K., "Bursty Channels, Interleavers, and Concatenation;"—Chapter 10 of book entitled: 'Error Correction Coding: Mathematical Methods and Algorithms;' Wiley Publications; Jan. 1, 2005; pp. 425-427.

* cited by examiner $$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

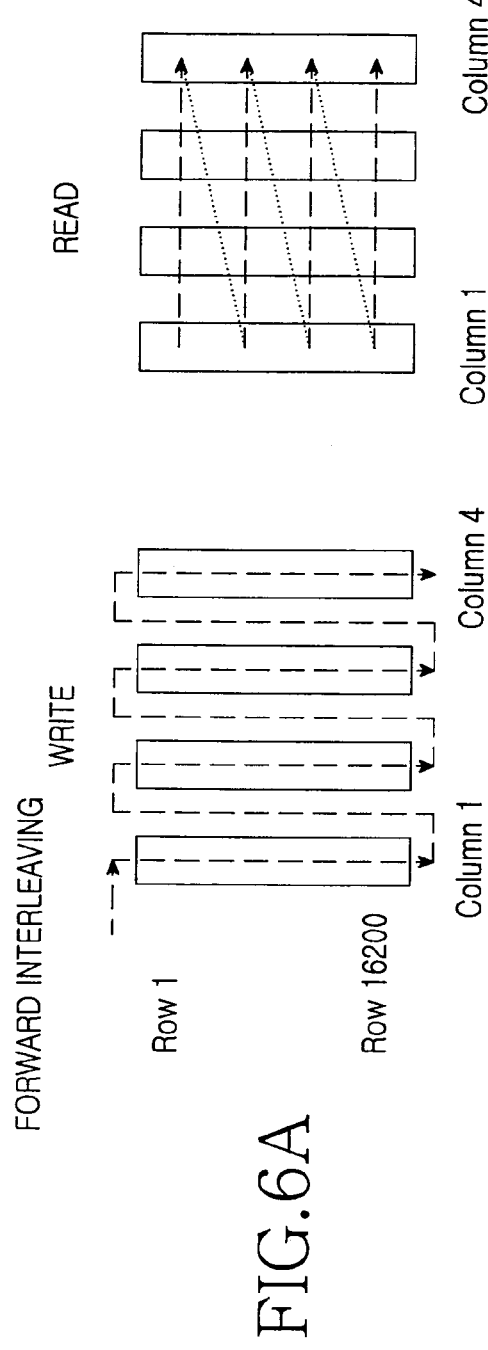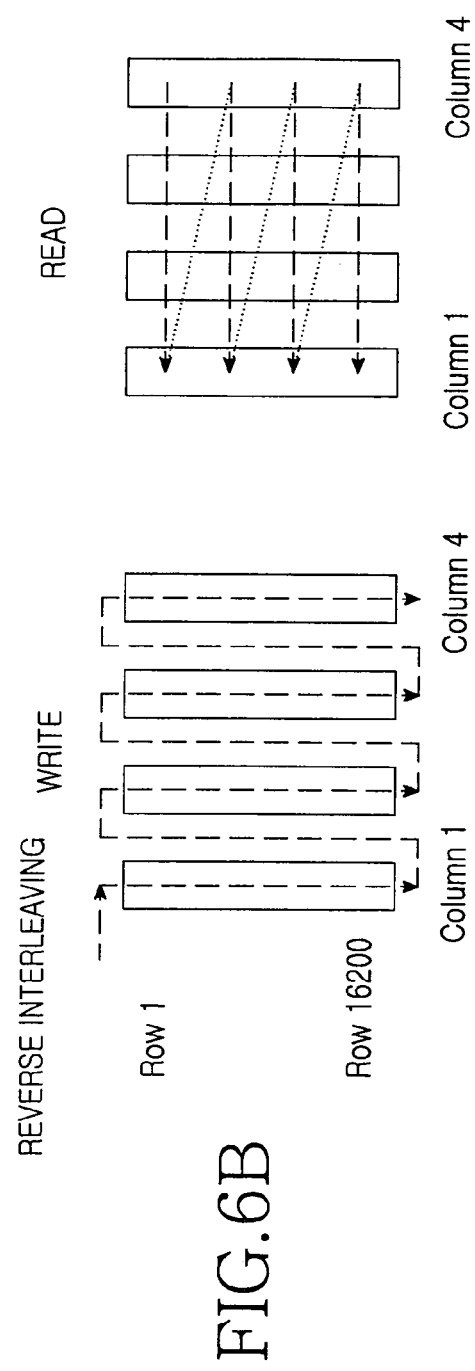
FIG.6A
FIG.6B

APPARATUS AND METHOD FOR TRANSMITTING AND RECEIVING DATA IN A COMMUNICATION SYSTEM USING LOW DENSITY PARITY CHECK CODES

CLAIM OF PRIORITY

This application claims the benefits under 35 U.S.C. §119 (a) of a Korean Patent Application filed in the Korean Intellectual Property Office on Aug. 28, 2007 and assigned Serial No. 2007-86786, a Korean Patent Application filed in the Korean Intellectual Property Office on Aug. 29, 2007 and assigned Serial No. 2007-87076, and a Korean Patent Application filed in the Korean Intellectual Property Office on Sep. 18, 2007 and assigned Serial No. 2007-94464, the disclosures of all of which are incorporated herein by reference.

BACKGROUND OF THE INVENTION

1. Field of the Invention

The present invention relates generally to an apparatus and method for transmitting and receiving data in a communication system, and in particular, to an apparatus and method of transmitting and receiving data in a communication system using Low Density Parity Check (LDPC) codes.

2. Description of the Related Art

A data transmission/reception process in a communication system can be described as follows.

The data generated from a transmission side is wireless-transmitted over a channel after undergoing source coding, channel coding, interleaving, and modulation. A reception side receives the wireless-transmitted signal, and performs demodulation, deinterleaving, channel decoding, and source decoding on the received signal.

However, the communication system may experience distortions of transmission signals due to channel noises, fading phenomenon, and Inter-Symbol Interference (ISI). Particularly, a high-speed digital communication system requiring high data throughput and reliability, such as the next generation mobile communication, digital broadcasting, and portable Internet, requires coping with the signal distortions caused by noises, fading and ISI. The channel coding and interleaving are the common technologies used for addressing the signal distortion in the high-speed digital communication system.

Interleaving minimizes a data transmission loss and increases a channel coding by dispersing damaged parts of desired transmission bits over several places without concentrating them in one location, thereby preventing burst errors that may occur frequently while the bits pass through a fading channel.

Channel coding is widely used for increasing communication reliability by allowing a reception side to detect and efficiently compensate for the signal distortion caused by noises, fading and ISI. The codes used for channel coding are known as error-correcting codes (ECC), which can correct errors. Currently, intensive research is being conducted on various types of error-correcting codes.

Well-known error-correcting codes may include block code, convolutional code, turbo code, Low Density Parity Check (LDPC) code, etc. As the present invention is related to a communication system using LDPC codes, a brief description of the LDPC code is provided below for a better understanding of the present invention.

The LDPC code is known as a code that can minimize a probability of an information loss even though it cannot guarantee complete signal transmission. That is, the LDPC code was first proposed in 1960 as a channel coding code capable of transmitting signals at a rate approximating the maximum data transfer rate (Shannon limit), which is known as the Shannon's channel coding theory. However, since the then-technological level for memories and operation processors was not adequate to realize the LDPC code, the LDPC code could not be implemented in the actual communication system. Thereafter, as the LDPC code has been rediscovered since 1996 owing to the development of the information theory and its associated technologies, active research is being conducted on a characteristic and a generation method for the LDPC code that does not noticeably increase its complexity though it uses iterative decoding. This LDPC code, together with the turbo code, has been evaluation and determined as a very excellent error-correcting code that can be used for a next generation mobile communication system, for example, the Long Term Evolution (LTE) system proposed by $3^{rd}$ Generation Partnership Project (3GPP) and the Mobile Worldwide Interoperability for Microwave Access (WiMax) system proposed by Institute of Electrical and Electronics Engineers (IEEE).

The LDPC code is generally expressed using a graphical expression method, and its many characteristics can be analyzed through the methods based on graph theory, algebra and probability theory. Generally, a graph model of the channel code can draw a natural decoding algorithm because not only it is useful for code descriptions but also it can map information on coded bits to vertexes in the graph. When relations between the bits are mapped to edges in the graph, the vertexes can be regarded as communication networks that exchange predetermined messages through the edges. For example, the known decoding algorithms derived from the trellis, which can be regarded as a kind of the graph, can include a Viterbi algorithm and a Bahl, Cocke, Jelinek and Raviv (BCJR) algorithm.

The LDPC code is generally defined as a parity check matrix, and can be expressed using a bipartite graph called a Tanner graph. The bipartite graph means that vertexes constituting the graph are divided into two different types, and the LDPC code is expressed as a bipartite graph composed of vertexes which are called "variable nodes" and "check nodes." The variable nodes are one-to-one mapped to coded bits.

With reference to FIGS. 1 and 2, a description will now be provided of a graphical expression method for the LDPC code.

FIG. 1 is a diagram illustrating a parity check matrix H1 of an LDPC code consisting of 4 rows and 8 columns, is considered. The matrix of FIG. 1 represents an LDPC code that generates length-8 codewords as it has 8 columns. That is, the columns are mapped to 8 coded bits.

FIG. 2 is a trellis diagram for a parity check matrix H1 of an LDPC code. This is a diagram illustrating a Tanner graph corresponding to H1 of FIG. 1. Referring to FIG. 2, the Tanner graph of an LDPC code is composed of 8 variable nodes $x_1$ (202), $x_2$ (204), $x_3$ (206), $x_4$ (208), $x_5$ (210), $x_6$ (212), $x_7$ (214) and $x_8$ (216), and 4 check nodes 218, 220, 222 and 224. An $i^{th}$ column and a $j^{th}$ row in the parity check matrix H1 of an LDPC code are mapped to a variable node $x_i$ and a $j^{th}$ check node, respectively. A value of 1, i.e., non-zero value at the point where an $i^{th}$ column and a $j^{th}$ row intersect in the parity check matrix H1 of an LDPC code, means that an edge exists between the variable node $x_i$ and the $j^{th}$ check node in the Tanner graph as illustrated in FIG. 2.

In the Tanner graph of an LDPC code, degree of a variable node and a check node mean the number of edges connected to the nodes, and this is equal to the number of non-zero entries in a column or row mapped to the corresponding node in the parity check matrix of an LDPC code. For example, in FIG. 2, degrees of variable nodes $x_1$ (202), $x_2$ (204), $x_3$ (206), $x_4$ (208), $x_5$ (210), $x_6$ (212), $x_7$ (214) and $x_8$ (216) are 4, 3, 3, 3, 2, 2, 2 and 2 in sequence, respectively, and degrees of check nodes 218, 220, 222 and 224 are 6, 5, 5 and 5 in sequence, respectively. In the columns of the parity check matrix H1 of FIG. 1, which are mapped to the variable nodes of FIG. 2, the number of non-zero entries are coincident with the degrees 4, 3, 3, 3, 2, 2, 2 and 2 in sequence, and in the rows of the parity check matrix H1 of FIG. 1, which are mapped to the check nodes of FIG. 2, the numbers of non-zero entries are coincident with the degrees 6, 5, 5 and 5 in sequence.

As described above, the coded bits are mapped one-to-one to columns of the parity check matrix, and also mapped one-to-one even to variable nodes in the Tanner graph. The degrees of the variable nodes which are mapped one-to-one to the coded bits are referred to as degrees of coded bits.

For the LDPC code, it is known that the higher-degree codeword bits are superior to the lower-degree codeword bits in decoding performance. This is due to the fact that higher-degree variable nodes can be superior in decoding performance to lower-degree variable nodes as they acquire more information through iterative decoding.

The LDPC code has been described so far. A description will now be provided of a signal constellation for the case in which the communication system employs Quadrature Amplitude Modulation (QAM) which is the commonly used high-order modulation scheme.

A QAM-modulated symbol is composed of a real part and an imaginary part, and various modulation symbols can be generated by varying sizes and signs of the real part and the imaginary part. For a better understanding of QAM characteristics, QAM will be described together with Quadrature Phase Shift Keying (QPSK) modulation.

FIG. 3A is a diagram illustrating a signal constellation of a general QPSK modulation scheme. In QPSK, two coded bits are mapped to one modulation symbol. Mapping two coded bits $y_0$ and $y_1$ to one modulation symbol has the following meaning. While $y_0$ determines a sign of the real part, $y_1$ determines a sign of the imaginary part. That is, a sign of the real part is plus (+) for $y_0=0$, and a sign of the real part is minus (−) for $y_0=1$. Similarly, a sign of the imaginary part is plus (+) for $y_1=0$, and a sign of the imaginary part is minus (−) for $y_1=1$. Since $y_0$ and $y_1$ are sign expression bits respectively representing signs of the real part and the imaginary part, $y_0$ and $y_1$ have an equal probability of error occurrence in the channel. Therefore, for QPSK modulation, the coded bits $y_0$ and $y_1$ mapped to one modulation symbol are equal in reliability.

FIG. 3B is a diagram illustrating a signal constellation of a general 16-QAM modulation scheme. In 16-QAM, 4 coded bits are mapped to one modulation symbol. Mapping 4 coded bits $y_0$, $y_1$, $y_2$ and $y_3$ to one modulation symbol has the following meaning. Bits $y_0$ and $y_2$ determine a sign and a size of the real part, respectively, and bit $y_1$ and $y_3$ determine a sign and a size of the imaginary part, respectively. In other words, $y_0$ and $y_1$ determine signs of the real part and the imaginary part of a signal, respectively, and $y_2$ and $y_3$ determine sizes of the real part and the imaginary part of a signal, respectively.

Generally, distinguishing a sign of a modulated signal is easier than distinguishing a size of a modulated signal. Therefore, it can be easily understood that $y_2$ and $y_3$ have a higher probability of error occurrence than $y_0$ and $y_1$, respectively. In conclusion, regarding the error-free probabilities (i.e. reliabilities) during transmission/reception of the bits, their orders are $y_0=y_1>y_2=y_3$. That is, QAM modulation symbol-constituting bits $y_0$, $y_1$, $y_2$ and $y_3$, unlike the QPSK modulation symbol-constituting bits, are different in reliability.

For 16-QAM modulation, among 4 bits constituting a signal, 2 bits determine signs of the real part and the imaginary part of the signal, and the other 2 bits represent sizes of the real part and the imaginary part of the signal. Therefore, it follows that the orders and roles of the bits $y_0$, $y_1$, $y_2$ and $y_3$ will be changed in accordance with a system design, as that design is different from the above.

FIG. 3C is a diagram illustrating a signal constellation of a general 64-QAM modulation scheme. In 64-QAM, 6 coded bits are mapped to one modulation symbol. Among $y_0$, $y_1$, $y_2$, $y_3$, $y_4$ and $y_5$ mapped to one modulation symbol, $y_0$ and $y_1$ determine signs of the real part and the imaginary part, respectively, and $(y_2, y_4)$ and $(y_3, y_5)$ determine sizes of the real part and the imaginary part, respectively.

Since distinguishing a sign of a modulated symbol is easier than distinguishing a size of a modulated symbol, $y_0$ and $y_1$ are higher than $y_2$, $y_3$, $y_4$ and $y_5$ in reliability. The bits $y_2$ and $y_3$ are determined according to whether the size of the modulated symbol is greater than or less than a value 4, and the bits $y_4$ and $y_5$ are determined according to whether the size of the modulated symbol is nearer to 4 or 0 from 2, or determined according to whether the size of the modulated symbol is closer to 4 or 8 from 6. Therefore, a determination range for $y_2$ and $y_3$ is 4, and a determination range for $y_4$ and $y_5$ is 2. Thus, $y_2$ and $y_3$ are higher than $y_4$ and $y_5$ in reliability. Summarizing, regarding the error-free probabilities (i.e., reliabilities) of the bits, their orders are $y_0=y_1>y_2=y_3>y_4=y_5$.

For 64-QAM modulation, among 6 bits constituting a signal, 2 bits determine signs of the real part and the imaginary part of the signal, and the other 4 bits only need to represent sizes of the real part and the imaginary part of the signal. Therefore, the orders and roles of the bits $y_0$, $y_1$, $y_2$, $y_3$, $y_4$ and $y_5$ can be changed according to a system design. Even for a signal constellation of 256-QAM or higher-order QAM, the roles and reliabilities of the modulation symbol-constituting bits are changed in the same manner as described above. A detailed description thereof will be omitted herein.

Conventionally, however, when the communication system using LDPC codes performs interleaving/deinterleaving, it uses an arbitrary interleaving/deinterleaving scheme regardless of the LDPC codes or the reliability characteristics of high-order modulation symbol-constituting bits, or uses an interleaving/deinterleaving scheme in which only the degrees of variable nodes or check nodes of the LDPC code are taken into consideration, making it impossible to minimize the distortion of a signal transmitted over a channel.

In addition, the use of the conventional high-order modulation maps the interleaved coded bits to the modulation symbol-constituting bits without taking into account the difference in reliability characteristics between the modulation symbol-constituting bits, thereby making it impossible to minimize the distortion of a signal transmitted over a channel.

SUMMARY OF THE INVENTION

The present invention provides a data transmission/reception apparatus and method for reducing signal distortion in a communication system using LDPC codewords.

In addition, the present invention provides an interleaving apparatus and method for improving performance of LDPC codewords in a communication system using LDPC codewords.

Further, the present invention provides a signal constellation bit mapping apparatus and method for improving performance of LDPC codewords in a communication system using LDPC codewords.

The present invention also provides an apparatus for transmitting data in a communication system using an LDPC matrix. This apparatus includes an interleaver for interleaving a descending bit-ordered codeword according to a predetermined size according to a predetermined modulation scheme; and includes a bit mapper for mapping codeword bits constituting the interleaved codeword according to a predetermined mapping scheme that takes into account degrees of the codeword bits and reliability characteristics of modulation symbol-constituting bits based on the predetermined modulation scheme.

The present invention also provides a method for transmitting data in a communication system using an LDPC matrix. The method includes interleaving a descending bit-ordered codeword having a predetermined size according to a predetermined modulation scheme and resulting in an interleaved codeword; and mapping codeword bits of the interleaved codeword according to a predetermined mapping scheme taking into account degrees of the codeword bits and reliability characteristics of modulation symbol-constituting bits based on the predetermined modulation scheme.

In an exemplary embodiment of the method of the present invention, the predetermined mapping scheme maps a two higher-degree bits among interleaved codeword bits to a two lower-reliability bits among modulation symbol-constituting bits in an iterative manner.

In an alternative exemplary embodiment of the method of the present invention, the predetermined mapping scheme maps a two highest-degree bits among the interleaved codeword bits to two lowest-reliability bits among the modulation symbol-constituting bits resulting in each of a non-mapped codeword bits and a non-mapped modulation symbol-constituting bits, and then maps a two higher-degree bits among the non-mapped codeword bits to a two higher-reliability bits among the non-mapped modulation symbol-constituting bits in an iterative manner.

Still further, the present invention provides an apparatus for receiving data in a communication system using an LDPC matrix. This apparatus includes a bit demapper for demapping modulation symbol-constituting bits of a wireless-transmitted signal according to a predetermined demapping scheme that takes into account degrees of codeword bits constituting a codeword used for the wireless-transmitted signal and reliability characteristics of the modulation symbol-constituting bits; and a deinterleaver for deinterleaving the demapped modulation symbol-constituting bits according to a predetermined demodulation scheme of the wireless-transmitted signal.

Still furthers yet, the present invention provides a method for receiving data in a communication system using an LDPC matrix. The method includes demapping modulation symbol-constituting bits of a wireless-transmitted signal according to a predetermined demapping scheme that takes into account degrees of codeword bits constituting a codeword used for the wireless-transmitted signal and reliability characteristics of the modulation symbol-constituting bits; and deinterleaving the demapped modulation symbol-constituting bits according to a predetermined demodulation scheme of the wireless-transmitted signal.

In an exemplary embodiment of the apparatus according to the present invention, the predetermined demapping scheme demaps a two lower-reliability bits among the modulation symbol-constituting bits to a two higher-degree bits among the codeword bits in an iterative manner.

In an alternative exemplary embodiment of the apparatus according to the present invention, the predetermined demapping scheme demaps a two lowest-reliability bits among the modulation symbol-constituting bits to a two highest-degree bits among the codeword bits resulting in a non-demapped codeword bits and a non-demapped modulation symbol-constituting bits, and then demaps a two lower-reliability bits among the non-demapped modulation symbol-constituting bits to a two higher-degree bits among the non-demapped codeword bits in an iterative manner.

BRIEF DESCRIPTION OF THE DRAWINGS

The above and other features and advantages of the present invention will become more apparent from the following detailed description when taken in conjunction with the accompanying drawings in which:

FIGS. 6A and 6B are diagrams illustrating operations of an interleaver using 16-QAM modulation according to an exemplary embodiment of the present invention;

DETAILED DESCRIPTION OF THE INVENTION

Exemplary embodiments of the present invention will now be described in detail with reference to the drawings. In the following description, a detailed description of known functions and configurations incorporated herein has been omitted for clarity and conciseness. Terms used herein are defined based on functions in the present invention and may vary according to users, operators' intention or usual practices. Therefore, the definition of the terms should be made based on contents throughout the specification.

Figures 1, 2:
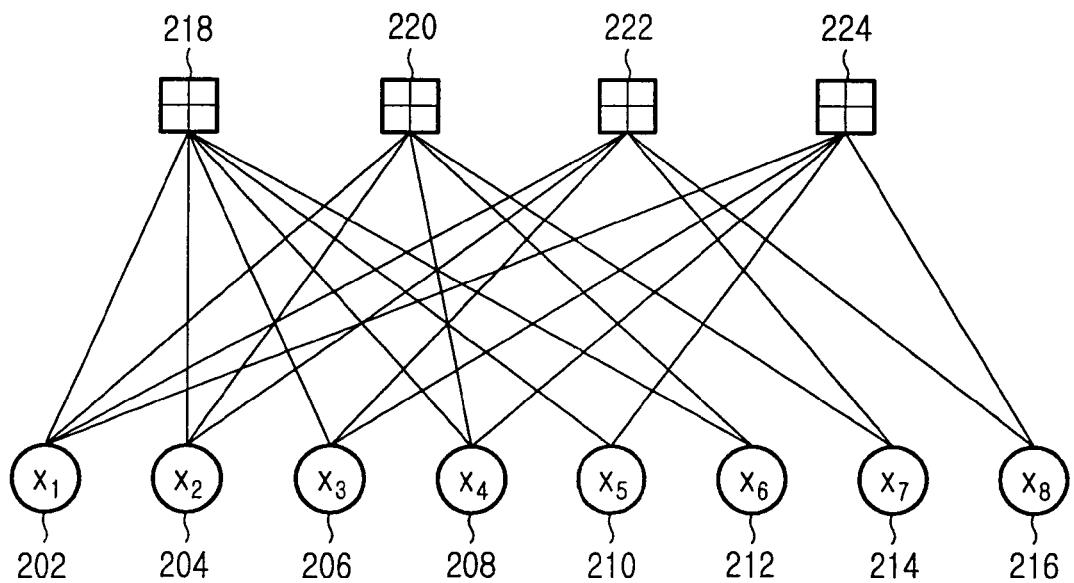
FIG. 1 is a diagram illustrating a parity check matrix H1 of an LDPC code.
FIG. 2 is a trellis diagram for a parity check matrix H1 of an LDPC code.
Figure 3A:
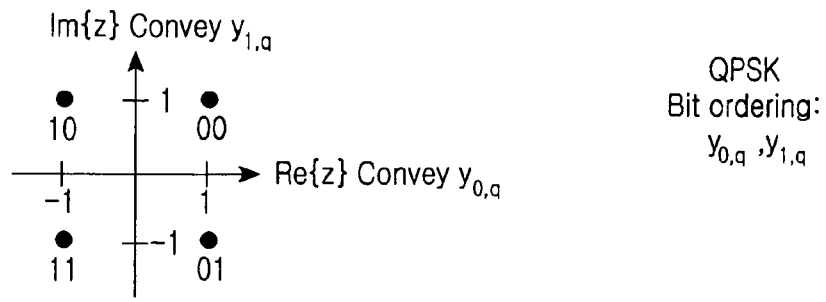
FIG. 3A is a diagram illustrating a signal constellation of a general QPSK modulation scheme.
Figure 3B:
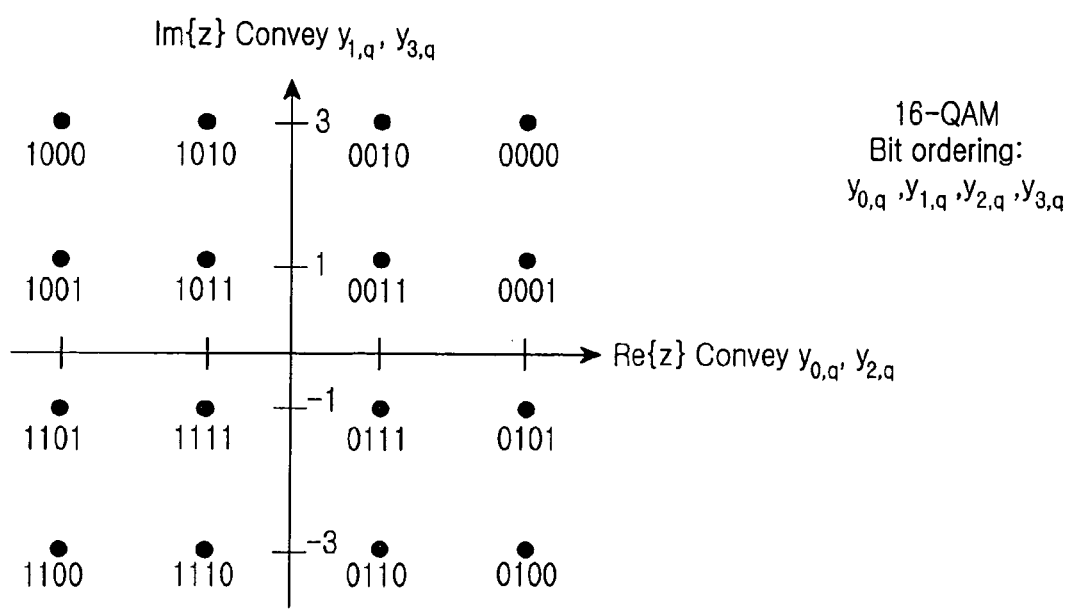
FIG. 3B is a diagram illustrating a signal constellation of a general 16-QAM modulation scheme.
Figure 3C:
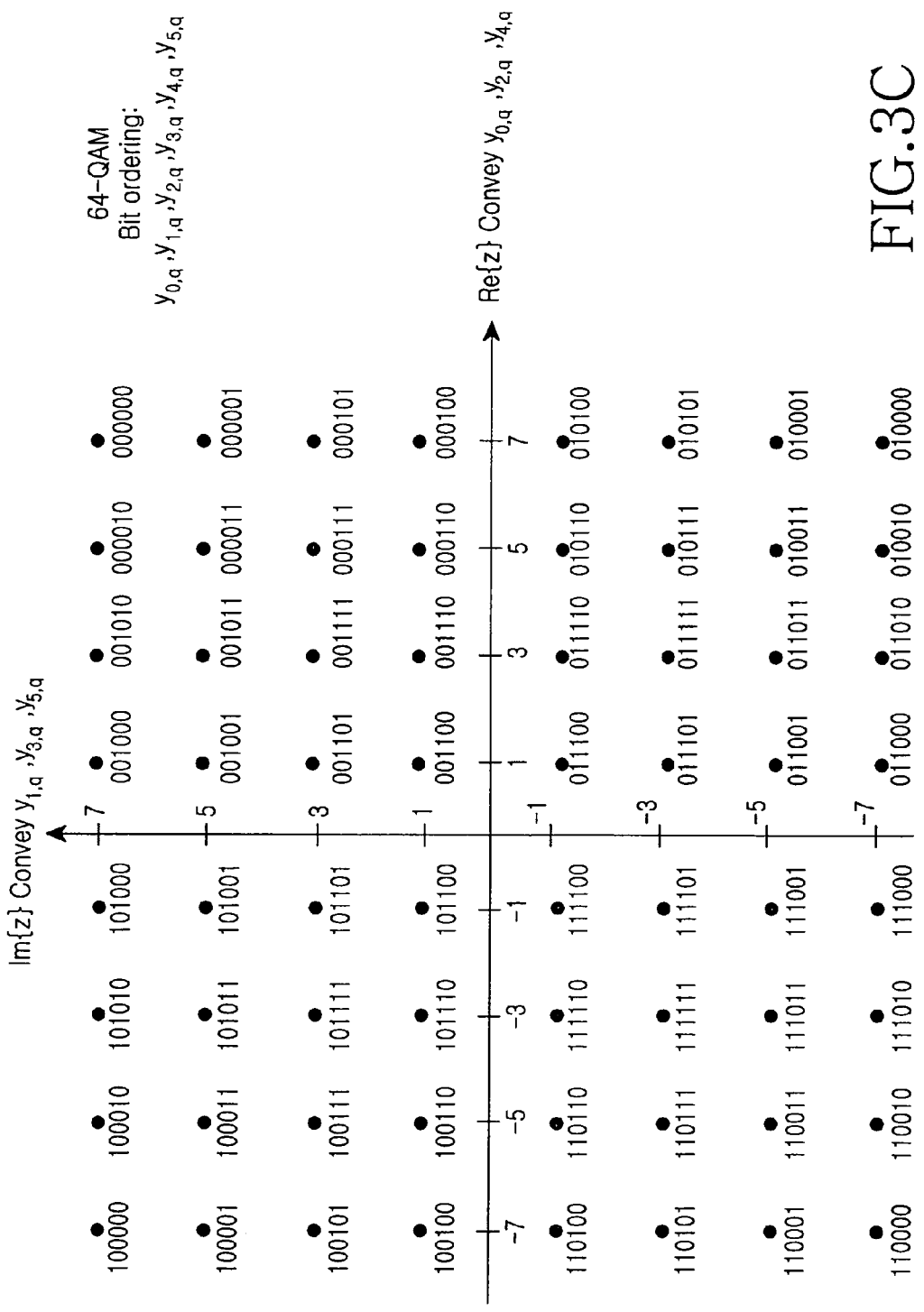
FIG. 3C is a diagram illustrating a signal constellation of a general 64-QAM modulation scheme.
Figure 4:
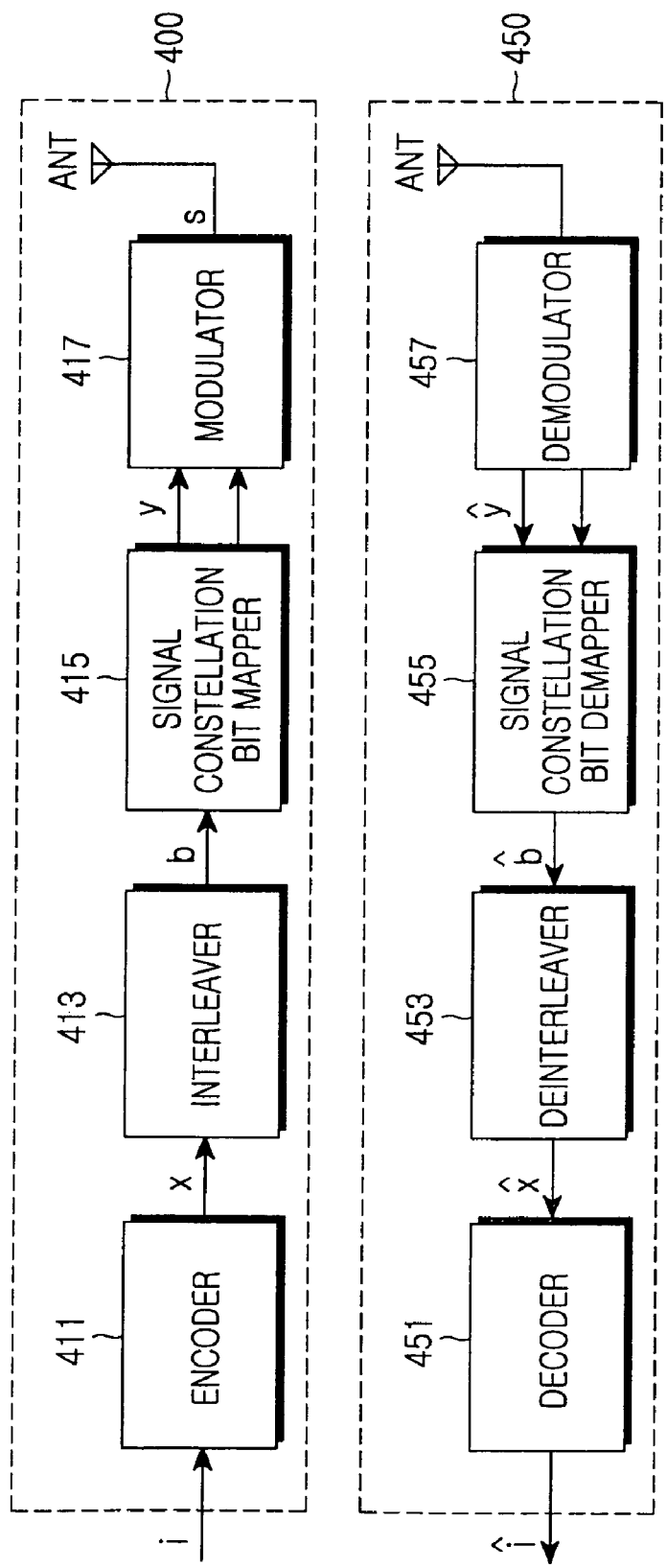
FIG. 4 is a block diagram illustrating a structure of a communication system using LDPC codes according to an exemplary of the present invention.

FIG. 4 is a block diagram illustrating a structure of a communication system using LDPC codes according to an exemplary embodiment of the present invention. A transmitter 400 of this exemplary embodiment of the present invention includes an encoder 411, an interleaver 413, a signal constellation bit mapper (bit mapping into constellation or signal constellation bit mapping) (hereinafter referred to as a "bit mapper" for short) 415, and a modulator 417. A receiver 450 of this exemplary embodiment of the present invention includes a demodulator 457, a signal constellation bit demapper (signal constellation bit demapping) (hereinafter referred to as a "bit demapper" for short) 455, a deinterleaver 453, and a decoder 451.

A brief description of operations of the transmitter and the receiver will first be given with reference to FIG. 4, and then the structures and operations of the interleaver and the bit mapper proposed by this exemplary embodiment of the present invention will be described in detail with reference to FIG. 5 and its succeeding drawings.

When an information data bit column (or information data bit stream) 'i' is input to the transmitter 400, the information data bit column i is delivered to the encoder 411, and the encoder 411 generates a codeword 'x' by coding the information data bits according to a predetermined coding scheme, and outputs a coded column to the interleaver 413. Herein, the encoder 411 is an LDPC encoder, so the codeword generated by the encoder 411 is an LDPC codeword.

The interleaver 413 interleaves the LDPC codeword output from the encoder 411 according to a predetermined interleaving scheme, and outputs the interleaved LDPC codeword to the bit mapper 415. The interleaving operation of the interleaver 413 is performed according to an interleaving scheme provided by the present invention. A detailed description of the interleaving scheme will be given below.

The bit mapper 415 performs signal constellation bit mapping on the bits (i.e., interleaved LDPC codeword) 'b' output from the interleaver 413 with a predetermined mapping scheme, and provides its output to the modulator 417. The bit mapper 415 performs the mapping according to a mapping scheme proposed by the present invention. The mapping scheme is to apply mapping to modulation symbol-constituting bits according to degree characteristics of the interleaved LDPC codeword 'b' and reliability characteristics of the modulation symbol-constituting bits, and a detailed description thereof will be given below.

The modulator 417 modulates the signals 'y' output from the bit mapper 415 with a predetermined modulation scheme, and transmits the modulated signal 's' via a transmit antenna Tx_ANT. The interleaver 413 and the bit mapper 415 perform interleaving and bit mapping so that the modulator 417 can minimize a codeword error rate (Bit Error Rate (BER) or Frame Error Rate (FER)) when modulating the interleaved LDPC codeword b, thereby increasing the performance.

The receiver 450 receives the signal transmitted from the transmitter 400, and outputs a signal that underwent a reverse process of the transmitter 400. That is, a signal received at the receiver 450 via a receive antenna Rx_ANT is delivered to the demodulator 457. The demodulator 457 demodulates the received signal with a demodulation scheme corresponding to the modulation scheme of the modulator 417 in the transmitter 400, and provides its output to the bit demapper 455.

The bit demapper 455 performs bit demapping on the signal output from the demodulator 457 according to the mapping scheme used in the bit mapper 415 of the transmitter 400, and then provides its output to the deinterleaver 453. The deinterleaver 453 deinterleaves the signal output from the bit demapper 455 according to the interleaving scheme applied in the interleaver 413 of the transmitter 400, and then provides its output to the decoder 451. The decoder 451 decodes the deinterleaved signal according to a decoding scheme corresponding to the coding scheme applied in the encoder 411 of the transmitter 400, to restore the signal to the final information data bits.

Meanwhile, in FIG. 4, the signal output from the modulator 417 is transmitted via the transmit antenna Tx_ANT after undergoing Radio Frequency (RF) processing in a separate RF transmitter (not shown) for RF signal transmission processing. Similarly, the signal received at the receive antenna Rx_ANT is input to the demodulator 457 after undergoing RF processing in an RF receiver (not shown) for RF signal reception processing.

The transmitter of the present invention is characterized by the interleaver 413 and the bit mapper 415, which use the characteristic that the bits mapped to the modulation symbol have unequal reliabilities in the high-order modulation scheme, and the receiver of the present invention is characterized by the deinterleaver 453 and the bit demapper 455, which use the unequal reliability characteristic of the high-order modulation scheme.

Figure 5:
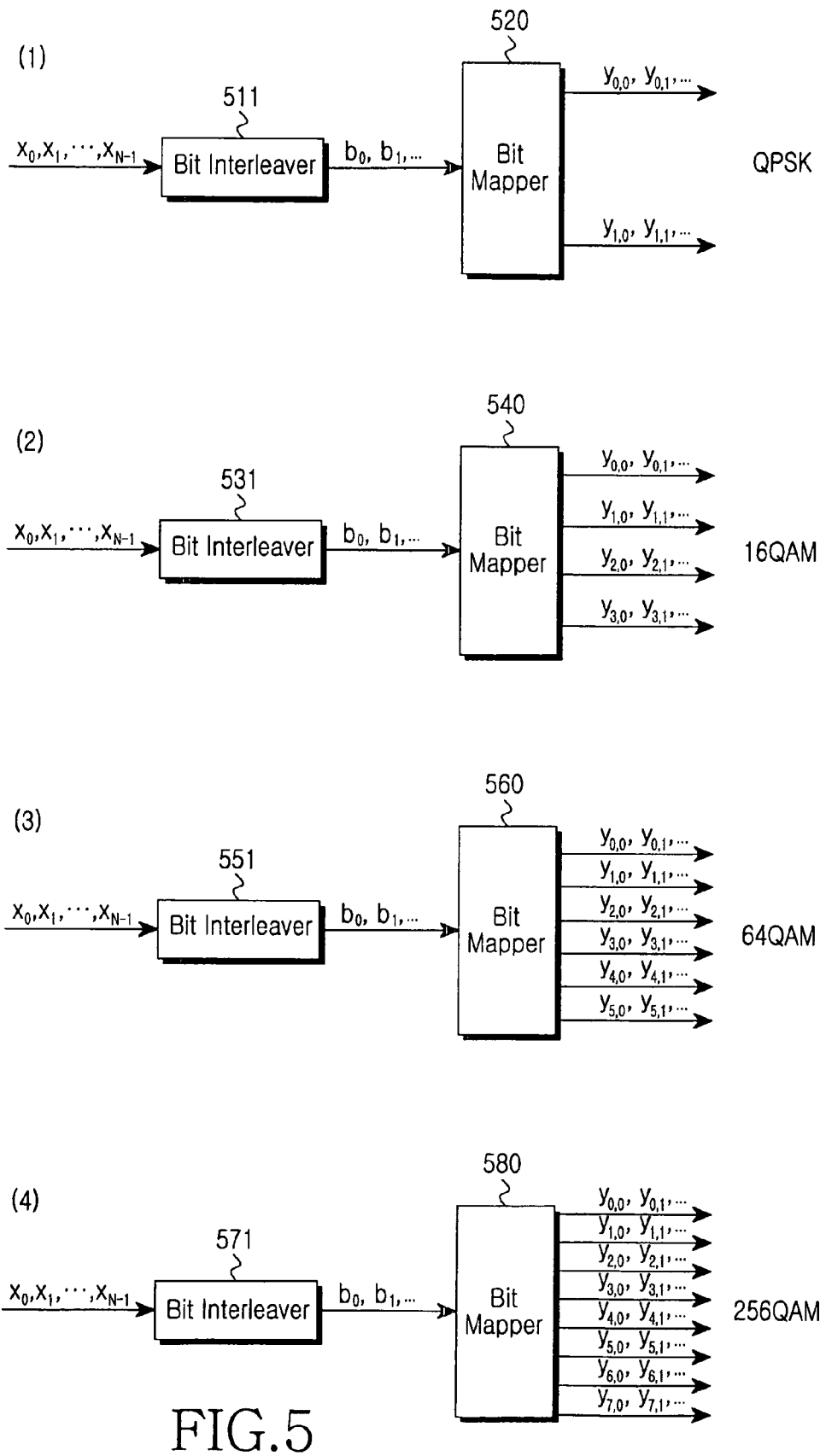
FIG. 5 is a diagram illustrating structures of an interleaver and a bit mapper according to an exemplary embodiment of the present invention.

With reference to FIG. 5, a brief description will now be made of operations of the interleaver and the bit mapper proposed by the present invention.

FIG. 5 is a diagram illustrating structures of an interleaver and a bit mapper according to an exemplary embodiment of the present invention, in which (1) is for QPSK, (2) is for 16-QAM, (3) is for 64-QAM, and (4) is for 256-QAM modulation.

When a coded bit column x ($x_0, x_1, \ldots, x_{N-1}$) is input to an interleaver (511, 531, 551, 571), an interleaved bit column b ($b_0, b_1 \ldots$) is output therefrom. The interleaved bit column b is input to a bit mapper (520, 540, 560, 580), and the input bit column b is separated into multiple bits y ($y_{0,0}, y_{1,0}$) after undergoing mapping according to a predetermined mapping scheme. The bit $y_{0,0}$ means a $0^{th}$ bit y which is output at $0^{th}$ time, and the bit $y_{1,0}$ means a $1^{st}$ bit y which is output at $0^{th}$ time. That is, this shows that the bits y are consecutively output N by N at the same time, where N is the predetermined number of bits. For example, at an arbitrary timing, the bit column b is separated into 2 bits y for (1) QPSK, into 4 bits y for (2) 16-QAM, into 6 bits y for (3) 64-QAM, and into 8 bits y for (4) 256-QAM, and the same operation is repeated at the next timing.

A mapping scheme in which the bits are mapped in the bit mapper (520, 540, 560, 580) is important, and the present invention provides this mapping scheme. A description of the mapping scheme will be made below. The bits output from the bit mapper (520, 540, 560, 580) must undergo another operation in which they are separated into a real part and an imaginary part, but a description thereof is not provided.

Although only the bit mapper (520, 540, 560, 580) is illustrated in FIG. 5, the bit mapper, to be specific, can be realized in the form of a demultiplexer and a mapper. That is, the bit mapper of FIG. 5 separates each input bit column into its bits, and maps them according to a mapping scheme. The bit mapper can be constructed such that the function of separating each input bit column into its bits is performed by a demultiplexer, and the succeeding mapping based on the mapping scheme is managed by a separate mapper.

A detailed description will now be made of an interleaving scheme in the interleaver (511, 531, 551, 571) of the present invention. For convenience, the description will be given for (2) 16-QAM modulation, by way of example. A similar interleaving scheme can be applied for other modulations.

LDPC codeword bits $x_0, x_1 \ldots, x_{N-2}, x_{N-1}$ are input to an interleaver 531. Output bits $b_0, b_1 \ldots, b_{N-2}, b_{N-1}$ of the interleaver 531 are input to a bit mapper 540 where they are separated into bits, the number of which is equal to the number of bits constituting a modulation symbol. That is, for 16-QAM, since a modulation symbol is composed of 4 bits, the input bits to the bit mapper 540 are separated into 4 bits. A bit mapping method is determined according to a mapping relation between the consecutively received 4 bits $b_0$, $b_1$, $b_2$, $b_3$ and the bits $y_0$, $y_1$, $y_2$, $y_3$ constituting a signal. A description of the bit mapping method will be given later.

A design process for an interleaver according to an exemplary embodiment of the present invention performs the following steps.

Step 1: determining a number of columns of an interleaver so that the number is equal to the number of bits used in a modulation symbol.

Step 2: determining a size-determined interleaver as a number of interleaver rows equal to a value obtained by dividing a length of a codeword by the number of columns, determined in Step 1.

Step 3: writing LDPC codeword bits in the size-determined interleaver in order of columns.

Step 4: reading bits from each column of codeword bits in a predetermined direction one by one.

Table 1 illustrates sizes of a row and a column of an interleaver for each modulation for the exemplary cases where a length N of a codeword is 16200 and 64800.

TABLE 1

| Modulation | Number of Rows | | Number of Columns |
|---|---|---|---|
| | N = 64800 | N = 16200 | |
| QPSK | 32400 | 8100 | 2 |
| 16QAM | 16200 | 4050 | 4 |
| 64QAM | 10800 | 2700 | 6 |
| 256QAM | 8100 | 2025 | 8 |

A description will now be made of design and operation of the interleaver, by way of example. It is assumed herein that bits in an LDPC matrix are sequentially ordered beginning from a higher-degree row, for the following reason. That is, as described above, the decoding performance is superior, as degrees of codeword bits mapped to variable nodes of the LDPC matrix are higher. Therefore, even the corresponding bits of a codeword generated considering a descending bit-ordered LDPC matrix are subject to descending bit ordering, and the orders of the codeword bits that underwent descending bit ordering determine the orders of decoding performance between the bits.

FIGS. 6A and 6B are diagrams illustrating operations of an interleaver using 16-QAM modulation according to an exemplary embodiment of the present invention. It is assumed in FIGS. 6A and 6B that the interleaver uses 16-QAM modulation and a length of an LDPC codeword is 64800. The 4-step design and operation of the interleaver will be described.

In Step 1, 4 columns are generated, the number of which is equal to the number of bits used in 16-QAM. In Step 2, the number of bits of a row is determined as 64800/4=16200. In Step 3, LDPC codeword bits are sequentially written in each column. The number of bits written in each column is the number, 16200, of rows. In Step 4, bits are sequentially read from each column one by one. In FIG. 6A, after sequentially reading bits from the first bit of a column 1 to the first bit of a column 4, the interleaver sequentially reads bits from the second bit of the column 1 to the second bit of the column 4. The interleaver repeats this process as many times as the number, 16200, of rows.

The interleaving scheme described up to now is a scheme in which bits are read in the direction of a column 1 to a column 4 of an interleaver. This interleaving scheme is defined as 'forward interleaving'. However, it is not necessary that the interleaver read bits only in the forward direction as illustrated in FIG. 6A. Therefore, an interleaving scheme in which the interleaver reads bits in the reverse direction as illustrated in FIG. 6B is defined as 'reverse interleaving'. The LDPC codeword is interleaved through one of the forward and reverse interleaving. The interleaver can be constructed such that in addition thereto, arbitrary interleaving can be performed even in each column in order to additionally increase the interleaving performance. If there is a correlation between adjacent codeword bits, the interleaving scheme can be made more robust to burst errors by performing interleaving.

Figure 7A:
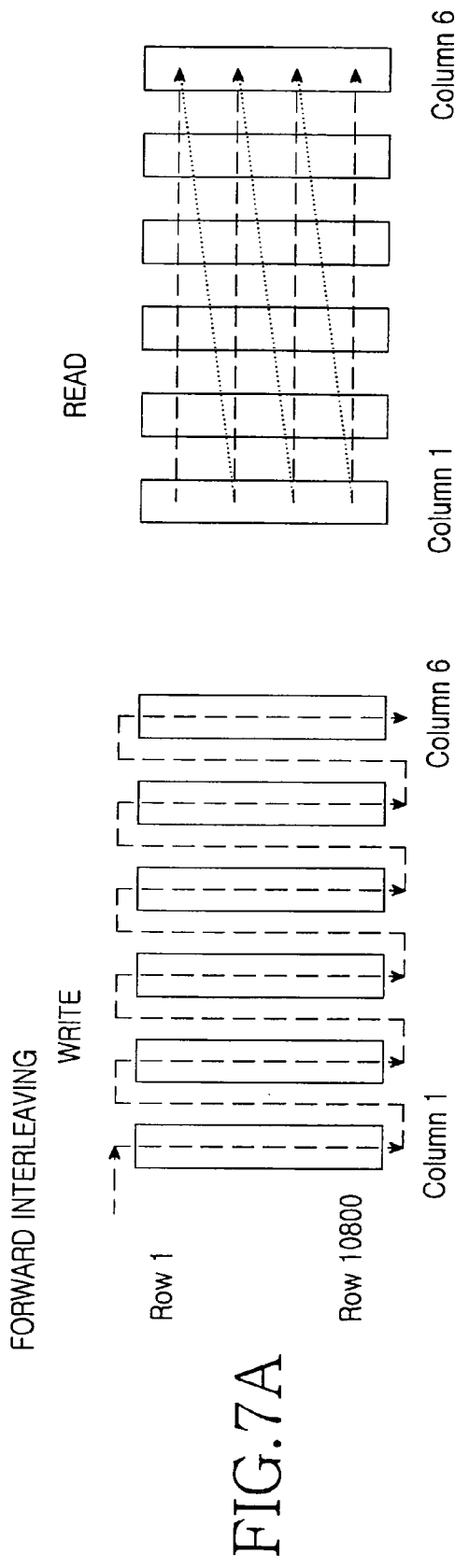
FIGS. 7A and 7B are diagrams illustrating operations of an interleaver using 64-QAM modulation according to an exemplary embodiment of the present invention.
Figure 7B:
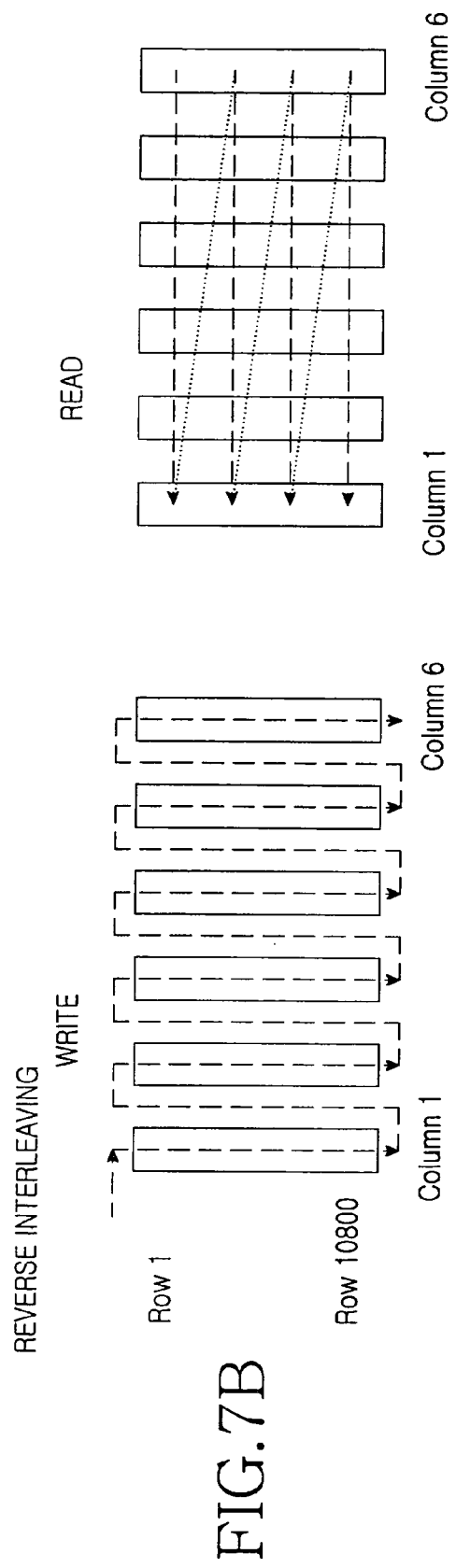

Even for 64-QAM modulation, the interleaver can operate in the same manner as described in FIGS. 6A and 6B. FIGS. 7A and 7B are diagrams illustrating operations of an interleaver using 64-QAM modulation according to an exemplary embodiment of the present invention. That is, FIG. 7A illustrates forward interleaving, and FIG. 7B illustrates reverse interleaving. Compared with FIGS. 6A and 6B, FIGS. 7A and 7B are different in that the number of columns of the interleaver is 6, and the number of rows is 10800.

A description of the interleaving scheme has been made so far. A description will now be made of the bit mapping scheme provided by the present invention.

The bit mapping scheme provided by the present invention is designed considering the fact that the decoding performance varies according to a degree of each bit of an LDPC codeword, and the fact that in high-order modulation, the bits constituting one modulation symbol are different in their reliability.

Considering these facts, the present invention provides bit mapping schemes according to two different exemplary embodiments. A bit mapping scheme based on a first exemplary embodiment will first be described.

First Exemplary Embodiment

A bit mapping scheme based on the first exemplary embodiment is a bit mapping scheme that maps the higher-degree bits to the lower-reliability bits among the modulation symbol-constituting bits on the basis of the output of one row among the interleaved outputs of an LDPC codeword, and maps lower-degree bits to higher-reliability bits, thereby minimizing the entire BER. In other words, the bit mapping scheme maps 2 highest-degree bits to 2 lowest-reliability bits, and maps 2 second highest-degree bits to 2 second lowest-reliability bits in order.

For example, in this bit mapping scheme, among the output (read) values of the interleaver described in FIG. 6A, output bits of the column 1 and the column 2 are allocated for lower-reliability bits among the modulation symbol-constituting bits, and bits read from the column 3 and the column 4 are allocated to the higher-reliability bits. Table 2 illustrates the results in which output bits of the interleaver are allocated to the modulation symbol-constituting bits according to the forward interleaving of FIG. 6A and each modulation scheme. The bit mapping corresponding to the forward interleaving is defined as 'forward bit mapping'.

TABLE 2

| QPSK |
|---|
| $b_0$ is mapped to $y_{0,0}$ |
| $b_1$ is mapped to $y_{1,0}$ |

| 16-QAM |
|---|
| $b_0$ is mapped to $y_{2,0}$ |
| $b_1$ is mapped to $y_{3,0}$ |
| $b_2$ is mapped to $y_{0,0}$ |
| $b_3$ is mapped to $y_{1,0}$ |

| 64-QAM |
|---|
| $b_0$ is mapped to $y_{4,0}$ |
| $b_1$ is mapped to $y_{5,0}$ |
| $b_2$ is mapped to $y_{2,0}$ |
| $b_3$ is mapped to $y_{3,0}$ |
| $b_4$ is mapped to $y_{0,0}$ |
| $b_5$ is mapped to $y_{1,0}$ |

| 256-QAM |
|---|
| $b_0$ is mapped to $y_{6,0}$ |
| $b_1$ is mapped to $y_{7,0}$ |
| $b_2$ is mapped to $y_{4,0}$ |
| $b_3$ is mapped to $y_{5,0}$ |
| $b_4$ is mapped to $y_{2,0}$ |
| $b_5$ is mapped to $y_{3,0}$ |
| $b_6$ is mapped to $y_{0,0}$ |
| $b_7$ is mapped to $y_{1,0}$ |

In Table 2, when the number of codeword bits is defined as N, output bits of the interleaver are expressed as $b=\{b_0, b_1, b_2, b_3, b_4, b_5, b_6, \ldots, b_N\}$. The first ($0^{th}$) read modulation symbol-constituting bits among the modulation symbol-constituting bits are denoted as $y_{0,0}$. That is, the first read modulation symbol-constituting bits are denoted as ($y_{0,0}, y_{0,1}$) for QPSK, as ($y_{0,0}, y_{1,0}, y_{2,0}, y_{3,0}$) for 16-QAM, as ($y_{0,0}, y_{1,0}, y_{2,0}, y_{3,0}, y_{4,0}, y_{5,0}$) for 64-QPSK, and as ($y_{0,0}, y_{1,0}, y_{2,0}, y_{3,0}, y_{4,0}, y_{5,0}, y_{6,0}, y_{7,0}$) for 256-QPSK.

If the interleaved codeword bits are mapped to the modulation symbol-constituting bits in the manner of Table 2, the lower-degree codeword bits are mapped to the higher-reliability bits among the modulation symbol-constituting bits, making it possible to increase the reliability in the decoding process even though many errors occur in the received signal.

For a better understanding, an operation of inputting/outputting (writing/reading) signals according to the interleaving and bit mapping schemes based on the first exemplary embodiment will be described with reference to FIGS. 8A and 8B.

Figure 8A:
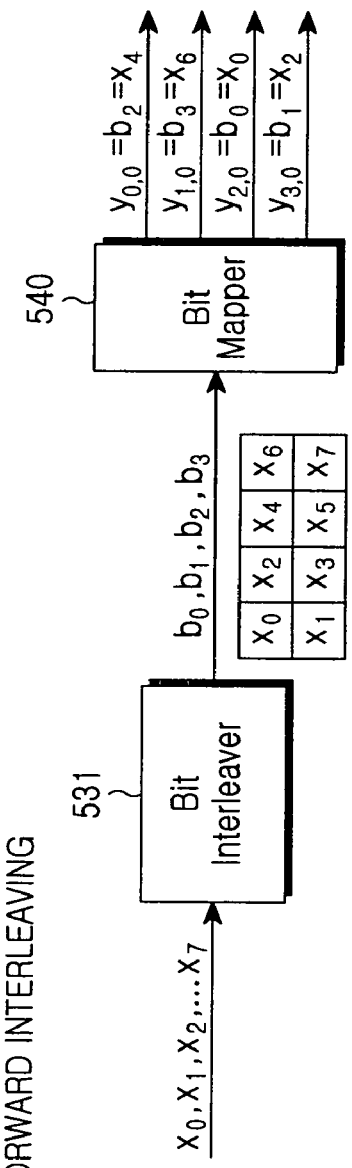
FIGS. 8A and 8B are diagrams illustrating an interleaving and bit mapping method according to a first exemplary embodiment of the present invention.
Figure 8B:
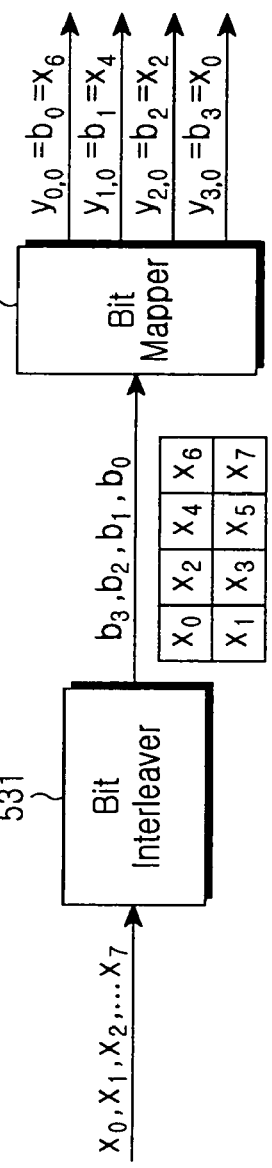

FIGS. 8A and 8B are diagrams illustrating an interleaving and bit mapping method according to the first exemplary embodiment of the present invention. Assuming that the modulation scheme is 16-QAM and a length of a codeword is 8, a column size of the interleaver is 4 and a row size is 2.

FIG. 8A illustrates forward bit mapping corresponding to the forward interleaving of FIG. 6A, and FIG. 8B illustrates reverse bit mapping corresponding to the reverse interleaving of FIG. 6B.

A description of FIG. 8A will be given. Assume that a codeword output from an LDPC encoder is $X=[x_0, x_1, x_2, x_3, x_4, x_5, x_6, x_7]$, and degrees of the codeword bits are [4, 4, 3, 3, 2, 2, 1, 1]. If the codeword bits are written in the interleaver in order of columns, codeword bits $\{x_0, x_1\}$ are written in a column 1 of the interleaver, codeword bits $\{x_2, x_3\}$ are written in a column 2, codeword bits $\{x_4, x_5\}$ are written in a column 3, and codeword bits $\{x_6, x_7\}$ are written in a column 4. The bits read from the bit-written columns in the forward direction in order of rows are $b=[b_0, b_1, b_2, b_3]=[x_0, x_2, x_4, x_6]$.

Since the bits 'b' are mapped according to the mapping rule of Table 2 after they are input to the bit mapper 540, the mapping results are given as $y=\{y_{0,0}, Y y_{1,0}, y_{2,0}, y_{3,0}\}=\{b_2, b_3, b_0, b_1\}=\{x_4, x_6, x_0, x_2\}$. That is, the codeword bits mapped to the higher-reliability sign-determining bits $y_{0,0}$ and $y_{1,0}$ are lower-decoding performance bits $x_4$ and $x_6$ as they are low in degree. In addition, the codeword bits mapped to the lower-reliability size-determining bits $y_{2,0}$ and $y_{3,0}$ are higher-decoding performance bits $x_0$ and $x_2$ as they are high in degree. Thereafter, the bits $y_{0,0}, y_{1,0}, y_{2,0}, y_{3,0}$ will be separated into a real part ($y_{0,0}, y_{2,0}$) and an imaginary part ($y_{1,0}, y_{3,0}$), but this is not shown.

A description of the forward interleaving and the forward bit mapping has been made so far with reference to FIG. 6A, Table 2 and FIG. 8A.

Similarly, Table 3 illustrates a reverse bit mapping scheme following the reverse interleaving of FIG. 6B. A mapping example based on the reverse interleaving of FIG. 6B and the reverse bit mapping scheme of Table 3 is illustrated in FIG. 8B.

TABLE 3

| QPSK |
|---|
| $b_0$ is mapped to $y_{0,0}$ |
| $b_1$ is mapped to $y_{1,0}$ |

| 16-QAM |
|---|
| $b_0$ is mapped to $y_{0,0}$ |
| $b_1$ is mapped to $y_{1,0}$ |
| $b_2$ is mapped to $y_{2,0}$ |
| $b_3$ is mapped to $y_{3,0}$ |

| 64-QAM |
|---|
| $b_0$ is mapped to $y_{0,0}$ |
| $b_1$ is mapped to $y_{1,0}$ |
| $b_2$ is mapped to $y_{2,0}$ |
| $b_3$ is mapped to $y_{3,0}$ |
| $b_4$ is mapped to $y_{4,0}$ |
| $b_5$ is mapped to $y_{5,0}$ |

| 256-QAM |
|---|
| $b_0$ is mapped to $y_{0,0}$ |
| $b_1$ is mapped to $y_{1,0}$ |
| $b_2$ is mapped to $y_{2,0}$ |
| $b_3$ is mapped to $y_{3,0}$ |
| $b_4$ is mapped to $y_{4,0}$ |
| $b_5$ is mapped to $y_{5,0}$ |
| $b_6$ is mapped to $y_{6,0}$ |
| $b_7$ is mapped to $y_{7,0}$ |

A comparison will now be made between the reverse bit mapping scheme and the forward bit mapping scheme.

Outputs of FIG. 8B are $Y=\{y_{0,0}, y_{1,0}, y_{2,0}, y_{3,0}\}=\{b_0, b_1, b_2, b_3\}=\{x_6, x_4, x_2, x_0\}$, and Outputs of FIG. 8A are $y=\{y_{0,0}, y_{1,0}, y_{2,0}, y_{3,0}\}=\{b_2, b_3, b_0, b_1\})=\{x_4, x_6, x_0, x_2\}$ Making an output comparison between both schemes, x mapped to $y_{0,0}$ is $x_4$ for FIG. 8A and $x_6$ for FIG. 8B, and inversely, x mapped to $y_{1,0}$ is $x_6$ for FIG. 8A and $x_4$ for FIG. 8B. However, since $y_{0,0}$ and $y_{1,0}$, both sign-determining bits, are equal in reliability, and $x_6$ and $x_4$ correspond to two lowest-degree bits among the 4 output bits, FIG. 7A and FIG. 7B will have the same result in terms of BER. As a result, since two lower-degree bits among the 4 bits are mapped to the higher-reliability modulation symbol-constituting bits, and two higher-degree bits $x_0$ and $x_2$ are mapped to two higher-reliability modulation symbol-constituting bits, both schemes may have the substantially same performance in terms of BER.

A description has been made as to the mapping relation between the interleaver input bits and the modulation symbol-constituting bits based on the first exemplary embodiment for 16-QAM. This will be described after it is generalized as a mapping relation based on the modulation scheme.

Assume that the modulation scheme is $2^{2m}$-QAM, the number of LDPC codeword bits is denoted by N, an $i^{th}$ modulation symbol is $y=\{y_{0,i}, y_{1,i}, \ldots, y_{2m-2,i}, y_{2m-1,i}\}$, and the interleaving is forward interleaving. In addition, if $y_{2m-1,i}$ and $y_{2m-2,i}$ mean two lowest-reliability bits, and $y_{1,i}$ and $y_{0,i}$ mean two highest-reliability bits, the mapping relation can be expressed as the following equation.

QPSK: $i=0, 1, \ldots, N/2-1$, (1)

$(y_{0,i}, y_{1,i}) = (x_i, x_{N/2+i})$

16-QAM: $i=0, 1, \ldots, N/4-1$, (2)

$(y_{0,i}, y_{1,i}, y_{2,i}, y_{3,i}) = (x_{2N/4+i}, x_{3N/4+i}, x_i, x_{N/4+i})$

64-QAM: $i=0, 1, \ldots, N/6-1$, (3)

$(y_{0,i}, y_{1,i}, y_{2,i}, y_{3,i}, y_{4,i}, y_{5,i}) = (x_{4N/6+i}, x_{5N/6+i}, x_{2N/6+i}, x_{3N/6+i}, x_i, x_{N/6+i})$

256-QAM: $i=0, 1, \ldots, N/8-1$, (4)

$(y_{0,i}, y_{1,i}, y_{2,i}, y_{3,i}, y_{4,i}, y_{5,i}, y_{6,i}, y_{7,i}) = (x_{6N/8+i}, x_{7N/8+i}, x_{4N/8+i}, x_{5N/8+i}, x_{2N/8+i}, x_{3N/8+i}, x_i, x_{N/8+i})$

The above-described mapping scheme based on the first exemplary embodiment will now be described after it is generalized. An N-bit codeword is divided into M groups, where M is the number of modulation symbol-constituting bits, and the number of entries in each group is N/M. Since the LDPC codeword bits underwent descending bit ordering, the highest-degree bits among the LDPC codeword bits belong to the first group, and the lowest-degree bits among the LDPC codeword bits belong to the last group. The bits belonging to the first and second groups are mapped to two lower-reliability bits among the modulation symbol-constituting bits, and the bits belonging to the last two groups are mapped to two higher-reliability bits among the modulation symbol-constituting bits.

A description will now be made of the bit mapping scheme based on the second exemplary embodiment.

Second Exemplary Embodiment

The bit mapping scheme based on the second exemplary embodiment is equal to the bit mapping scheme of the first exemplary embodiment in that it maps the higher-degree bits, i.e., the first and second highest-degree bits, to the lower-reliability bits among the modulation symbol-constituting bits on the basis of the output of one row among the interleaved outputs of an LDPC codeword. However, the bit mapping scheme based on the second exemplary embodiment maps the next highest-degree bits, i.e., the third and fourth highest-degree bits, to two higher-reliability bits among the modulation symbol-constituting bits. Thereafter, the bit mapping scheme maps the fifth and sixth highest-degree bits to two higher-reliability bits among the remaining bits except for the already-mapped bits among the modulation symbol-constituting bits. The bit mapping scheme repeats the mapping operation.

For example, it is assumed that the number of LDPC codeword bits is 6, and 64-QAM modulation is used. In a codeword $b=[b_1\ b_2\ b_3\ \ldots\ b_6]$ where bits are ordered in the higher degree order, a group composed of $\{b_1\ b_2\}$ is assumed to be $G_1$, a group composed of $\{b_3, b_4\}$ is assumed to be $G_2$, and a group composed of $\{b_5, b_6\}$ is assumed to be $G_3$. Of the groups, the highest-degree group $G_1$ is mapped to the lowest-reliability bits $\{y_5, y_6\}$ among the modulation symbol-constituting bits, and the second highest-degree group $G_2$ is mapped to the highest-reliability bits $\{y_1, y_2\}$.

Although the mapping scheme of the first exemplary embodiment maps two higher-degree bits to the lower-reliability bits, and then maps the two lowest-degree bits to higher-reliability bits, the second exemplary embodiment is different from the first exemplary embodiment in that it maps two second highest-degree bits to the higher-reliability bits.

The reason for disclosing a second exemplary embodiment that is different from the first exemplary embodiment is as follows.

In order to improve decoding performance at a reception side, there is a need to improve decoding performance of information bits rather than parity bits including no information. Therefore, it is possible to obtain excellent decoding performance by mapping the information bits to the higher-reliability modulation symbol-constituting bits. In order to obtain such an effect, information bits are allocated in the higher degree order when designing LDPC codes. Thus, in most cases, many information bits are included in the group $G_2$. Accordingly, it is possible to improve the decoding performance by mapping the bits belonging to the group $G_2$ to the higher-reliability modulation symbol-constituting bits.

Also, it is known that the LDPC code affects decoding performance between different bits in the LDPC iterative decoding process. That is, an increase in the degrees of the LDPC code increases the influence on the decoding performance of different bits. Therefore, the error, which occurs in the higher-degree bits, may reduce decoding performance of many different bits, and in order to increase decoding performance of the entire system, it is necessary to minimize error occurrence for the higher-degree bits. Since the bits in $G_2$ are lower in degree than the bits belonging to $G_1$, the bits of $G_2$ are not higher than the bits of $G_1$ in terms of an average improvement of the decoding performance. However, since there is a high probability that the bits of $G_2$ will have higher degrees than the bits in the group $G_3$ or its succeeding groups, the bits of $G_2$ may exert significant influence on different bits in the decoding process. Therefore, the second exemplary embodiment minimizes the probability of error occurrence by mapping the higher-degree bits to the higher-reliability modulation symbol-constituting bits in this way, to thereby improve reliabilities of different bits together in the decoding process.

For a better understanding of the detailed operation of the second exemplary embodiment, an interleaving scheme for 64-QAM will be described by way of example. In this interleaving scheme, among the output values of the interleaver described in FIGS. 7A and 7B, output bits of the column 1 and the column 2 are allocated to lower-reliability bits among the modulation symbol-constituting bits, and the second highest-degree bits read from the column 3 and the column 4 are allocated to higher-reliability bits.

Table 4 illustrates an interleaving scheme in which outputs of the forward interleaver in FIG. 7A are mapped to modulation symbol-constituting bits for each modulation scheme.

TABLE 4

| QPSK |
|---|
| $b_0$ is mapped to $y_{0,0}$ |
| $b_1$ is mapped to $y_{1,0}$ |
| 16-QAM |
| $b_0$ is mapped to $y_{2,0}$ |
| $b_1$ is mapped to $y_{3,0}$ |
| $b_2$ is mapped to $y_{0,0}$ |
| $b_3$ is mapped to $y_{1,0}$ |

TABLE 4-continued

64-QAM $b_0$ is mapped to $y_{4,0}$
$b_1$ is mapped to $y_{5,0}$
$b_2$ is mapped to $y_{0,0}$
$b_3$ is mapped to $y_{1,0}$
$b_4$ is mapped to $y_{2,0}$
$b_5$ is mapped to $y_{3,0}$

256-QAM $b_0$ is mapped to $y_{6,0}$
$b_1$ is mapped to $y_{7,0}$
$b_2$ is mapped to $y_{0,0}$
$b_3$ is mapped to $y_{1,0}$
$b_4$ is mapped to $y_{2,0}$
$b_5$ is mapped to $y_{3,0}$
$b_6$ is mapped to $y_{4,0}$
$b_7$ is mapped to $y_{5,0}$ For 256-QAM in Table 4, mapping positions of $b_4$ and $b_5$ can be exchanged with mapping positions of $b_6$ and $b_7$. That is, there are alternative exemplary embodiments of mapping $b_4$ to $y_{4,0}$ and $b_5$ to $y_{5,0}$, and mapping $b_6$ to $y_{2,0}$ and $b_7$ to $y_{3,0}$.

Making a comparison between Table 2 and Table 4, it can be seen that the first exemplary embodiment and the second exemplary embodiment are subject to the same mapping in 16-QAM and its lower-order QAM (QPSK). However, there is a difference in mapping results between both exemplary embodiments in 64-QAM and its higher-order QAM (256-QAM). If the interleaved codeword bits are mapped to modulation symbol-constituting bits in this manner, codeword bits having the third and fourth highest degrees are mapped to the higher-reliability bits among the modulation symbol-constituting bits, making it possible to increase the reliability in the decoding process even though many errors occur in the received signal. For a better understanding, an operation of inputting/outputting (writing/reading) signals according to the interleaving and bit mapping schemes based on the second exemplary embodiment of the present invention will be described in brief with reference to FIGS. 9A and 9B.

Figure 9A:
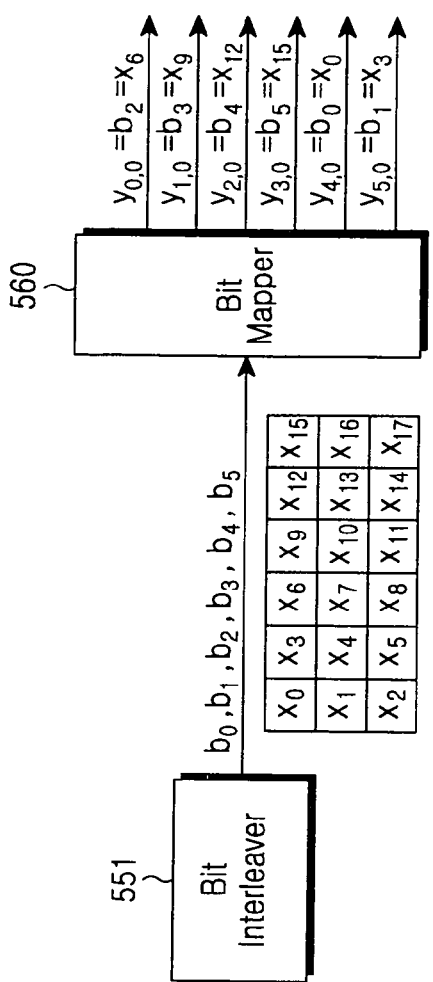
FIGS. 9A and 9B are diagrams illustrating an interleaving and bit mapping method according to a second exemplary embodiment of the present invention.
Figure 9B:
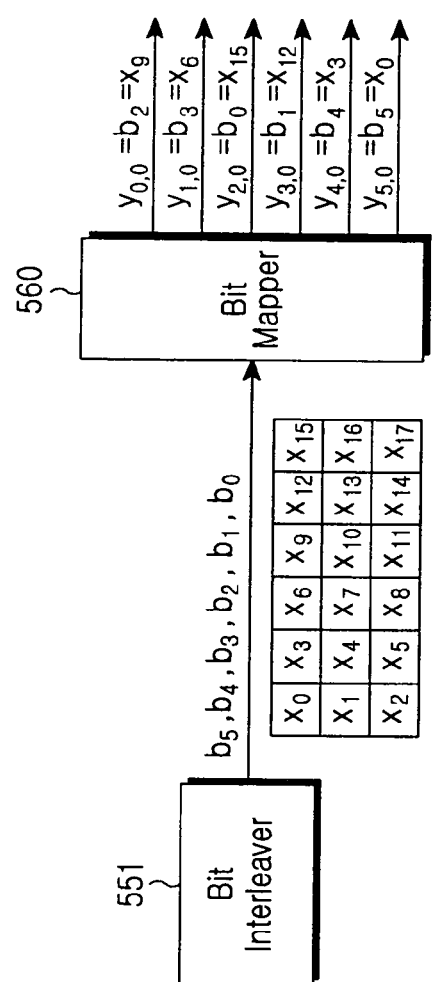

FIGS. 9A and 9B are diagrams illustrating an interleaving and bit mapping method according to the second exemplary embodiment of the present invention. Assuming that the modulation scheme is 64-QAM and a length of a codeword is 18, a column size of the interleaver is 6 and a row size is 3.

FIG. 9A illustrates forward bit mapping corresponding to the forward interleaving of FIG. 7A, and FIG. 9B illustrates reverse bit mapping corresponding to the reverse interleaving of FIG. 7B.

A description of FIG. 9A will be given. Assume that a codeword output from an LDPC encoder is $X=[x_0, x_1, x_2, x_3, x_4, x_5, x_6, x_7, x_8, x_9, x_{10}, x_{11}, x_{12}, x_{13}, x_{14}, x_{15}, x_{16}, x_{17}]$, and degrees of the codeword bits are [12, 12, 12, 12, 3, 3, 3, 3, 3, 3, 3, 2, 2, 2, 2, 2, 2].

If the codeword bits are written in the interleaver 551 in order of columns, codeword bits $\{x_0, x_1, x_2\}$ are written in a column 1 of the interleaver 551, codeword bits $\{x_3, x_4, x_5\}$ are written in a column 2, codeword bits $\{x_6, x_7, x_8\}$ are written in a column 3, codeword bits $\{x_9, x_{10}, x_{11}\}$ are written in a column 4, codeword bits $\{x_{12}, x_{13}, x_{14}\}$ are written in a column 5, and codeword bits $\{x_{15}, x_{16}, x_{17}\}$ are written in a column 6. The bits read from the bit-written columns in the forward direction in order of rows are $b=[b_0, b_1, b_2, b_3, b_4, b_5]=[x_0, x_3, x_6, x_9, x_{12}, x_{15}]$.

Since the bits b are mapped according to the above mapping rule after they are input to the bit mapper 560, the mapping results are given as $y=\{y_{0,0}, y_{1,0}, y_{2,0}, y_{3,0}, y_{4,0}, y_{5,0}\}=\{b_2, b_3, b_4, b_5, b_0, b_1\})=\{x_6, x_9, x_{12}, x_{15}, x_0, x_3\}$. That is, the codeword bits mapped to the higher-reliability sign-determining bits $y_{0,0}$ and $y_{1,0}$ are $x_6$ and $x_9$ belonging to the second group $G_2$. In addition, the codeword bits mapped to the size-determining bits $y_{4,0}$ and $y_{5,0}$ are the bits $x_0$ and $x_3$ that have high decoding performance as they are high in degree.

The forward interleaving and forward bit mapping has been described so far with reference to FIG. 6A, Table 2, and FIG. 8A.

Similarly, Table 5 illustrates a reverse bit mapping scheme following the reverse interleaving of FIG. 7B. A mapping example based on the reverse interleaving of FIG. 7B and the reverse bit mapping scheme of Table 5 is illustrated in FIG. 9B.

TABLE 5

QPSK $b_0$ is mapped to $y_{0,0}$
$b_1$ is mapped to $y_{1,0}$

16-QAM $b_0$ is mapped to $y_{0,0}$
$b_1$ is mapped to $y_{1,0}$
$b_2$ is mapped to $y_{2,0}$
$b_3$ is mapped to $y_{3,0}$

64-QAM $b_0$ is mapped to $y_{2,0}$
$b_1$ is mapped to $y_{3,0}$
$b_2$ is mapped to $y_{0,0}$
$b_3$ is mapped to $y_{1,0}$
$b_4$ is mapped to $y_{4,0}$
$b_5$ is mapped to $y_{5,0}$

256-QAM $b_0$ is mapped to $y_{4,0}$
$b_1$ is mapped to $y_{5,0}$
$b_2$ is mapped to $y_{2,0}$
$b_3$ is mapped to $y_{3,0}$
$b_4$ is mapped to $y_{0,0}$
$b_5$ is mapped to $y_{1,0}$
$b_6$ is mapped to $y_{6,0}$
$b_7$ is mapped to $y_{7,0}$ The forward bit mapping results and the reverse bit mapping results based on the second exemplary embodiment are equal in terms of both BER and performance. A detailed description thereof has been given, making a comparison between the forward bit mapping and the reverse bit mapping of the first exemplary embodiment.

A mapping relation between the interleaver output bits and the modulation symbol-constituting bits of the second exemplary embodiment has been described so far for 64-QAM, by way of example. This will be described after being generalized as a mapping relation based on the modulation scheme.

Assume that the modulation scheme is $2^{2m}$-QAM, the number of LDPC codeword bits is denoted by N, an $i^{th}$ modulation symbol is $y=\{y_{0,i}, y_{1,i}, \ldots, y_{2m-2,i}, y_{2m-1,i}\}$, and the interleaving is forward interleaving. In addition, if $y_{2m-1,i}$ and $y_{2m-2,i}$ mean two lowest-reliability bits, and $y_{1,i}$ and $y_{0,i}$ mean two highest-reliability bits, the mapping relation can be expressed as the following equation.

QPSK: $i=0, 1, \ldots, N/2-1$, (1)

$$(y_{0,i}, y_{1,i}) = (x_i, x_{N/2+i})$$

16-QAM: $i=0, 1, \ldots, N/4-1$, (2)

$$(y_{0,i}, y_{1,i}, y_{2,i}, y_{3,i}) = (x_{2N/4+i}, x_{3N/4+i}, x_i, x_{N/4+i})$$

64-QAM: $i=0, 1, \ldots, N/6-1,$ (3)

$$(y_{0,i}, y_{1,i}, y_{2,i}, y_{3,i}, y_{4,i}, y_{5,i}) = (x_{4N/6+i}, x_{5N/6+i}, x_{2N/6+i}, x_{3N/6+i}, x_i, x_{N/6+i})$$

256-QAM: $i=0, 1, \ldots, N/8-1,$ (4)

$$(y_{0,i}, y_{1,i}, y_{2,i}, y_{3,i}, y_{4,i}, y_{5,i}, y_{6,i}, y_{7,i}) = (x_{6N/8+i}, x_{7N/8+i}, x_{4N/8+i}, x_{5N/8+i}, x_{2N/8+i}, x_{3N/8+i}, x_i, x_{N/8+i})$$

The above-described mapping scheme of the second exemplary embodiment will now be described after it has been generalized. An N-bit codeword is divided into M groups, where M is the number of modulation symbol-constituting bits, and the number of entries in each group is N/M. Since the LDPC codeword bits underwent descending bit ordering, the highest-degree bits among the LDPC codeword bits belong to the first group, and the lowest-degree bits among the LDPC codeword bits belong to the last group. The bits belonging to the first and second groups are mapped to two lower-reliability bits among the bits constituting the real part and the imaginary part, and the bits belonging to the third and fourth groups are mapped to two highest-reliability bits among the bits constituting the real part and the imaginary part.

Although an interleaver and a bit mapper are used herein, they can be realized by software implementing the functions of the interleaver based on the above-described mapping scheme in stored in a memory without constructing the bit mapper and the interleaver by hardware. In some cases, however, they can also be realized by directly mapping the codeword bits to the modulation symbol-constituting bits.

A description will now be made of performance improvement during data transmission by the interleaving and bit mapping schemes of the present invention.

Figure 10:
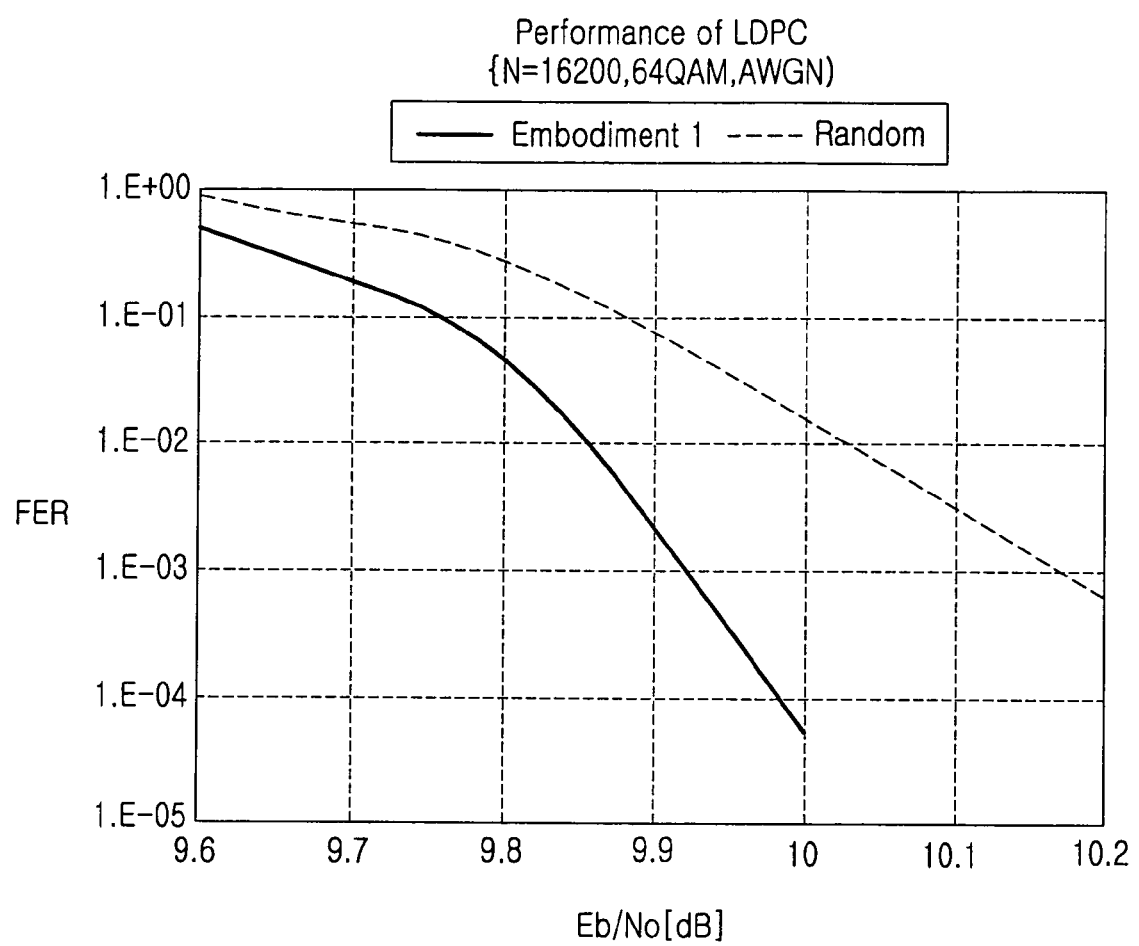
FIG. 10 is a diagram illustrating performance improvement based on the data transmission scheme according to the first exemplary embodiment of the present invention.

FIG. 10 is a diagram illustrating performance improvement based on the data transmission scheme according to the first exemplary embodiment of the present invention. Illustrated in FIG. 10 is a codeword error rate (FER) when an LDPC codeword with a length N=16200 is used. In addition, the simulation results were obtained when 64-QAM modulation symbols were used in the Additive White Gaussian Noise (AWGN) channel. The dotted curve represents a codeword error rate of the interleaver designed by the random scheme, and the solid curve represents a codeword error rate when the interleaver and the bit mapping scheme of the present invention are used. It can be understood that the present invention can obtain a performance gain of about 0.3 dB at FER=$10^{-3}$.

Figure 11:
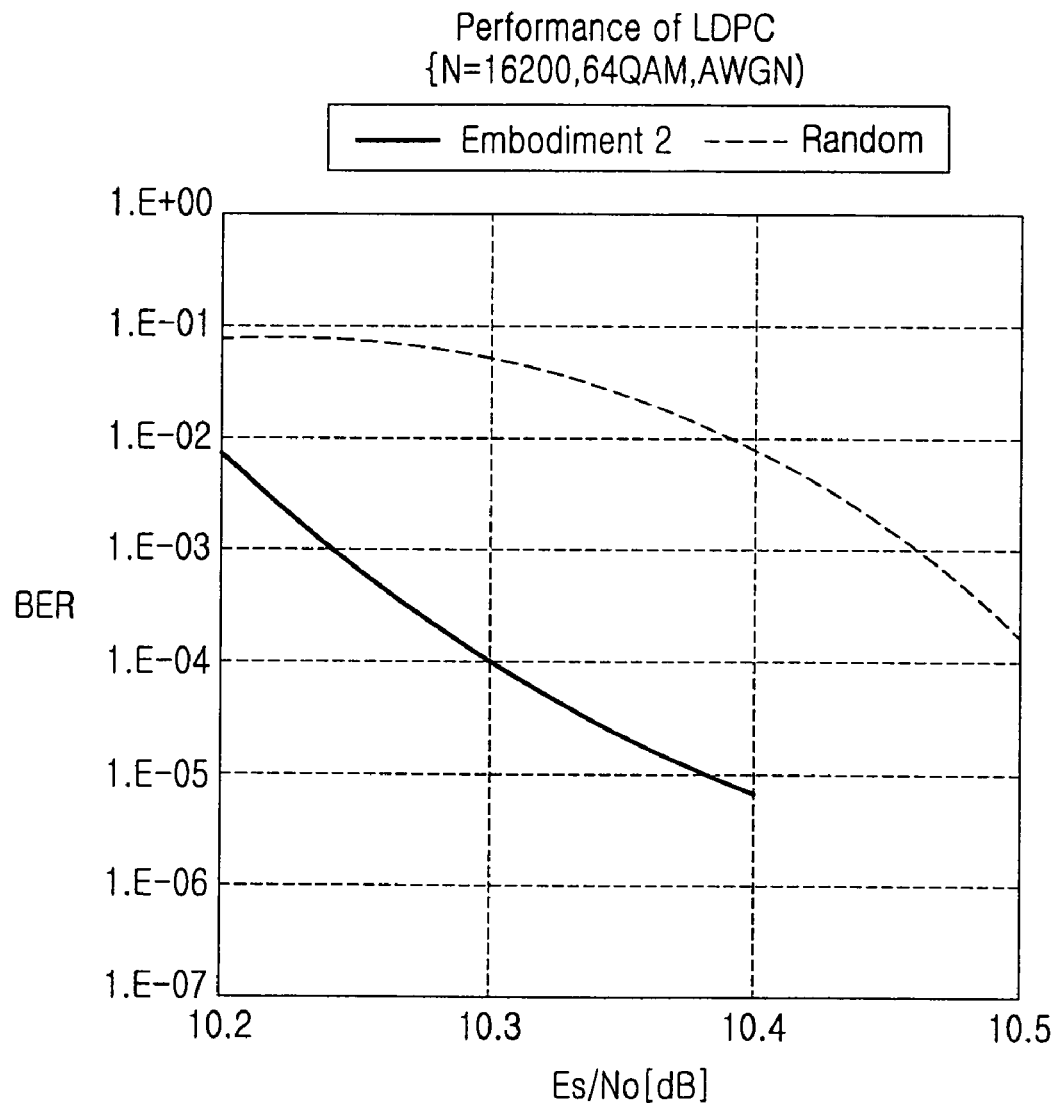
FIG. 11 is a diagram illustrating performance improvement based on the data transmission scheme according to the second exemplary embodiment of the present invention.

FIG. 11 is a diagram illustrating performance improvement based on the data transmission scheme according to the second exemplary embodiment of the present invention. Illustrated in FIG. 11 is a codeword error rate (BER) when an LDPC codeword with a length N=64800 is used. In addition, the simulation results were obtained when 64-QAM modulation symbols were used in the AWGN channel. The dotted curve represents a codeword error rate of the interleaver designed by the random scheme, and the solid curve represents a codeword error rate when the interleaver and the bit mapping scheme of the present invention are used. It can be appreciated that the present invention can obtain a performance gain of about 0.2 dB at BER=$10^{-4}$.

The interleaving scheme and the bit mapping scheme in the transmitter 400 according to the first and second exemplary embodiments have been described so far. A description will now be made of the deinterleaving and bit demapping schemes used in the receiver 450. Since it would be obvious to those skilled in the art that the receiver 450 is constructed in association with the transmitter 400, a description thereof will be given in brief.

That is, the demodulator 457 in the receiver 450 performs high-order demodulation on the received signal and outputs modulation symbol-constituting bits, and the signal constellation bit demapper 455 performs bit demapping on the output modulation symbol-constituting bits and outputs a demapped signal. The demapping method used for this operation corresponds to the bit mapping scheme of the transmitter 400. That is, the demapping method demaps two higher-reliability bits among the modulation symbol-constituting bits to lower-degree LDPC codeword bits, and demaps two lower-reliability bits to higher-degree LDPC codeword bits. In addition, since the bit demapper 455 corresponds to the bit mapper 415 in the transmitter 400, it is composed of a demapper (not shown) and a multiplexer (not shown).

The bit-demapped output signal is input to the deinterleaver 453. The deinterleaver 453 is equal in size to the interleaver 413 in the transmitter 400. Deinterleaved LDPC codeword bits are output by writing the bit-demapped signal in the deinterleaver 453 in order of rows and then reading them in order of columns in the forward direction (beginning from a row 1). The output LDPC codewords are input to the decoder 451 where they undergo decoding. If the interleaving used in the transmitter 400 was reverse interleaving, the deinterleaving in the receiver 450 is also performed in the reverse direction.

As is apparent from the foregoing description, the present invention can maximize performance of LDPC codewords in a communication system using LDPC codewords. In addition, the present invention can improve decoding performance of LDPC codes. In particular, the present invention can improve reliabilities of low-error correction capability bits among the bits constituting an LDPC code.

Moreover, the present invention can increase performance of the link especially in the wireless channel environment has a high probability that the link performance will decrease due to noises, fading phenomenon and ISI, thereby improving the data transmission/reception reliability. The reliable transmission/reception of the LDPC code can reduce the signal error probability of the entire communication system, facilitating the high-speed communication.

While the invention has been illustrated and described with reference to a certain preferred exemplary embodiments thereof, it will be understood by those skilled in the art that various changes in form and details may be made therein without departing from the spirit and scope of the invention as defined by the appended claims.

What is claimed is:

1. A transmitter in a communication system, comprising:
    an interleaver for interleaving Low Density Parity Check (LDPC) codeword bits included in an LDPC codeword using an interleaving scheme and outputting the interleaved LDPC codeword bits by a size of a modulation symbol being generated using a modulation scheme, wherein the modulation symbol having a difference in reliability characteristics between modulation symbol-constituting bits included in the modulation symbol, and the LDPC codeword bits are sequentially ordered beginning from a higher-degree; and
    a bit mapper for mapping the interleaved LDPC codeword bits using a mapping scheme to the modulation symbol-constituting bits,
    wherein the mapping scheme takes into account degrees of the interleaved LDPC codeword bits, the degrees being degrees of variable nodes which are mapped one-to-one to the interleaved LDPC codeword bits, and reliability characteristics of the modulation symbol-constituting bits, and wherein the mapping scheme maps the two highest-degree bits among the interleaved LDPC codeword bits to the two lowest-reliability bits among the modulation symbol-constituting bits in an iterative manner.

2. The transmitter of claim 1, wherein the mapping scheme maps the two highest-degree bits among non-mapped interleaved LDPC codeword bits except for the mapped interleaved LDPC codeword bits among the interleaved LDPC codeword bits to the two highest-reliability bits among non-mapped modulation symbol-constituting bits except for the mapped modulation symbol-constituting bits among the modulation symbol-constituting bits in an iterative manner until there are no non-mapped interleaved LDPC codeword bits.

3. The transmitter of claim 1, wherein the interleaver has N columns and M rows, N is equal to the size of the modulation symbol, and M is equal to a value obtained by dividing a size of the LDPC codeword by N, and
wherein the LDPC codeword bits are written in a column order and the written LDPC codeword bits are read from the M rows in a forward direction.

4. The transmitter of claim 1, wherein the interleaver has N columns and M rows, N is equal to the size of the modulation symbol, and M is equal to a value obtained by dividing a size of the LDPC codeword by N, and
wherein the LDPC codeword bits are written in column order and the written LDPC codeword bits are read from the M rows in a reverse direction.

5. A receiver in a communication system, comprising:
a bit demapper for demapping a demodulated signal using a demapping scheme according to a mapping scheme used in a bit mapper of a transmitter to an interleaved signal; and
a deinterleaver for deinterleaving the interleaved signal using a deinterleaving scheme according to an interleaving scheme used in an interleaver of the transmitter and outputting a Low Density Parity Check (LDPC) codeword,
wherein the mapping scheme takes into account degrees of an interleaved LDPC codeword bits, the degrees being degrees of variable nodes which are mapped one-to-one to the interleaved LDPC codeword bits, and reliability characteristics of a modulation symbol-constituting bits,
wherein the mapping scheme maps the two highest-degree bits among the interleaved LDPC codeword bits to the two lowest-reliability bits among the modulation symbol-constituting bits in an iterative manner,
wherein the interleaver outputs the interleaved LDPC codeword bits by a size of a modulation symbol being generated using a modulation scheme, and
wherein the modulation symbol having a difference in reliability characteristics between modulation symbol-constituting bits included in the modulation symbol, and the LDPC codeword bits are sequentially ordered beginning from a higher-degree.

6. The receiver of claim 5, wherein the mapping scheme maps the two highest-degree bits among non-mapped interleaved LDPC codeword bits except for the mapped interleaved LDPC codeword bits among the interleaved LDPC codeword bits to the two highest-reliability bits among non-mapped modulation symbol-constituting bits except for the mapped modulation symbol-constituting bits among the modulation symbol-constituting bits in an iterative manner until there are no non-mapped interleaved LDPC codeword bits.

7. The receiver of claim 5, wherein the interleaver has N columns and M rows, N is equal to the size of the modulation symbol, and M is equal to a value obtained by dividing a size of the LDPC codeword by N, and
wherein the LDPC codeword bits are written in a column order and the written LDPC codeword bits are read from the M rows in a forward direction.

8. The receiver of claim 5, wherein the interleaver has N columns and M rows, N is equal to the size of the modulation symbol, and M is equal to a value obtained by dividing a size of the LDPC codeword by N, and
wherein the LDPC codeword bits are written in column order and the written LDPC codeword bits are read from the M rows in a reverse direction.

9. A method for transmitting data in a communication system, the method comprising:
interleaving Low Density Parity Check (LDPC) codeword bits included in an LDPC codeword using an interleaving scheme and outputting the interleaved LDPC codeword bits by a size of a modulation symbol being generated using a modulation scheme, wherein the modulation symbol having a difference in reliability characteristics between modulation symbol-constituting bits included in the modulation symbol, and the LDPC codeword bits are sequentially ordered beginning from a higher-degree; and
mapping the interleaved LDPC codeword bits using a mapping scheme to the modulation symbol-constituting bits,
wherein the mapping scheme takes into account degrees of the interleaved LDPC codeword bits, the degrees being degrees of variable nodes which are mapped one-to-one to the interleaved LDPC codeword bits, and reliability characteristics of the modulation symbol-constituting bits, and
wherein the mapping scheme maps the two highest-degree bits among the interleaved LDPC codeword bits to the two lowest-reliability bits among the modulation symbol-constituting bits in an iterative manner.

10. The method of claim 9, wherein the mapping scheme maps the two highest-degree bits among non-mapped interleaved LDPC codeword bits except for the mapped interleaved LDPC codeword bits among the interleaved LDPC codeword bits to the two highest-reliability bits among non-mapped modulation symbol-constituting bits except for the mapped modulation symbol-constituting bits among the modulation symbol-constituting bits in an iterative manner until there are no non-mapped interleaved LDPC codeword bits.

11. The method of claim 9, wherein interleaving comprises:
writing the LDPC codeword bits in an order of N columns in an interleaver having N columns and M rows, N is equal to the size of the modulation symbol, and M is equal to a value obtained by dividing a size of the LDPC codeword by N; and
reading the written LDPC codeword bits from the M rows in a forward direction.

12. The method of claim 9, wherein interleaving comprises:
writing the LDPC codeword bits in an order of N columns in an interleaver having N columns and M rows, N is equal to the size of the modulation symbol, and M is equal to a value obtained by dividing a size of the LDPC codeword by N; and
reading the written LDPC codeword bits from the M rows in a reverse direction.

13. A method for receiving data in a communication system, the method comprising:
- demapping a demodulated signal using a demapping scheme according to a mapping scheme used in a bit mapper of a transmitter to an interleaved signal; and
- deinterleaving the interleaved signal using a deinterleaving scheme according to an interleaving scheme used in an interleaver of the transmitter and outputting a Low Density Parity Check (LDPC) codeword,
- wherein the mapping scheme takes into account degrees of an interleaved LDPC codeword bits, the degrees being degrees of variable nodes which are mapped one-to-one to the interleaved LDPC codeword bits, and reliability characteristics of a modulation symbol-constituting bits,
- wherein the mapping scheme maps the two highest-degree bits among the interleaved LDPC codeword bits to the two lowest-reliability bits among the modulation symbol-constituting bits in an iterative manner,
- wherein the interleaved LDPC codeword bits are outputted by the interleaver by a size of a modulation symbol being generated using a modulation scheme, and
- wherein the modulation symbol having a difference in reliability characteristics between modulation symbol-constituting bits included in the modulation symbol, and the LDPC codeword bits are sequentially ordered beginning from a higher-degree.

14. The method of claim 13, wherein the mapping scheme maps the two highest-degree bits among non-mapped interleaved LDPC codeword bits except for the mapped interleaved LDPC codeword bits among the interleaved LDPC codeword bits to the two highest-reliability bits among non-mapped modulation symbol-constituting bits except for the mapped modulation symbol-constituting bits among the modulation symbol-constituting bits in an iterative manner until there are no non-mapped interleaved LDPC codeword bits.

15. The method of claim 13, wherein the interleaver has N columns and M rows, N is equal to the size of the modulation symbol, and M is equal to a value obtained by dividing a size of the LDPC codeword by N, and
- wherein the LDPC codeword bits are written in a column order and the written LDPC codeword bits are read from the M rows in a forward direction.

16. The method of claim 13, wherein the interleaver has N columns and M rows, N is equal to the size of the modulation symbol, and M is equal to a value obtained by dividing a size of the LDPC codeword by N, and
- wherein the LDPC codeword bits are written in column order and the written LDPC codeword bits are read from the M rows in a reverse direction.

* * * * *